(12) United States Patent
Su

(10) Patent No.: US 12,068,405 B2
(45) Date of Patent: Aug. 20, 2024

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Sheng-Kai Su, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 27 days.

(21) Appl. No.: 17/852,079

(22) Filed: Jun. 28, 2022

(65) Prior Publication Data

US 2022/0336647 A1 Oct. 20, 2022

Related U.S. Application Data

(62) Division of application No. 16/656,210, filed on Oct. 17, 2019, now Pat. No. 11,380,785.

(51) Int. Cl.
| | |
|---|---|
| *H01L 29/76* | (2006.01) |
| *H01L 29/24* | (2006.01) |
| *H01L 29/66* | (2006.01) |
| *H01L 29/78* | (2006.01) |

(52) U.S. Cl.
CPC .......... *H01L 29/7606* (2013.01); *H01L 29/24* (2013.01); *H01L 29/66969* (2013.01); *H01L 29/7851* (2013.01)

(58) Field of Classification Search
CPC ................ H01L 29/7606; H01L 29/24; H01L 29/66969; H01L 29/7851
USPC .......................................... 257/29
See application file for complete search history.

(56) References Cited

U.S. PATENT DOCUMENTS

| | | | |
|---|---|---|---|
| 2011/0101308 A1* | 5/2011 | Avouris | ............. H01L 29/4908 977/734 |
| 2013/0048948 A1 | 2/2013 | Heo et al. | |
| 2015/0014630 A1 | 1/2015 | Choi et al. | |
| 2015/0303299 A1 | 10/2015 | Chang et al. | |
| 2015/0364592 A1 | 12/2015 | Van et al. | |

(Continued)

OTHER PUBLICATIONS

Y. Wang et. al., "Monolayer PtSe2, a New Semiconducting Transition-Metal-Dichalcogenide, Epitaxially Grown by Direct Selenization of Pt", Nano Lett. 2015, 15, 4013-4018.

(Continued)

*Primary Examiner* — Dzung Tran
(74) *Attorney, Agent, or Firm* — Maschoff Brennan

(57) ABSTRACT

A method includes forming a semiconductor fin protruding above a substrate; forming a first 2D material layer across the semiconductor fin; depositing a gate material layer over the first 2D material layer; etching the gate material layer and the first 2D material layer to form a gate structure and a patterned first 2D material layer under the gate structure; laterally growing a second 2D material layer from the patterned first 2D material layer to beyond the gate structure; after laterally growing the second 2D material layer, forming gate spacers respectively on opposite sidewalls of the gate structure; and after forming the gate spacers, forming a third 2D material layer on the second 2D material layer until a combination of the third 2D material layer and the second 2D material layer comprises at least three or more monolayers of $PtSe_2$.

20 Claims, 51 Drawing Sheets

(56) References Cited

U.S. PATENT DOCUMENTS

| | | |
|---|---|---|
| 2016/0190343 A1 | 6/2016 | Hou et al. |
| 2016/0343805 A1 | 11/2016 | Lee et al. |
| 2018/0182849 A1 | 6/2018 | Alian et al. |
| 2019/0123149 A1 | 4/2019 | Lee et al. |

OTHER PUBLICATIONS

K. Zhang et. al., "Experimental evidence for type-II Dirac semimetal in PtSe2", Physical Review B 96, 125102 (2017), pp. 125102-1-125102-6.

A. Ciarrocchi et. al., "Thickness-modulated metal-to-semiconductor transformation in a transition metaldichalcogenide", Nature Communications (Mar. 2, 2018), pp. 1-6.

A. Kandemir et. al., "Structural, electronic and phononic properties of PtSe2: from monolayer to bulk", Semicond. Sci. Technol. 33 (Jun. 29, 2018) 085002 (7pp).

\* cited by examiner

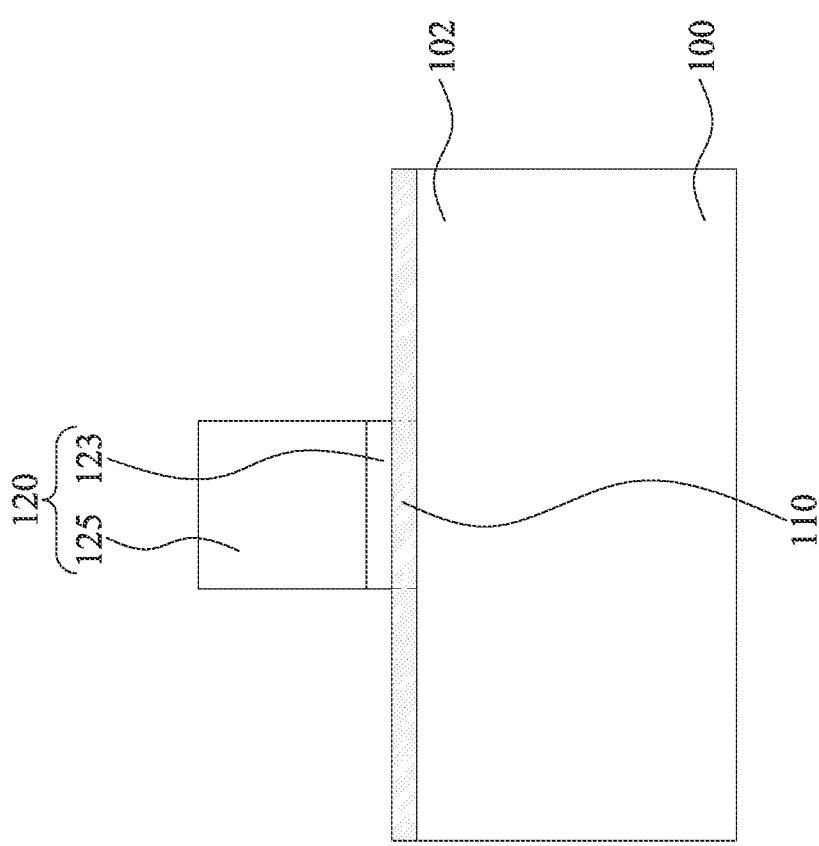

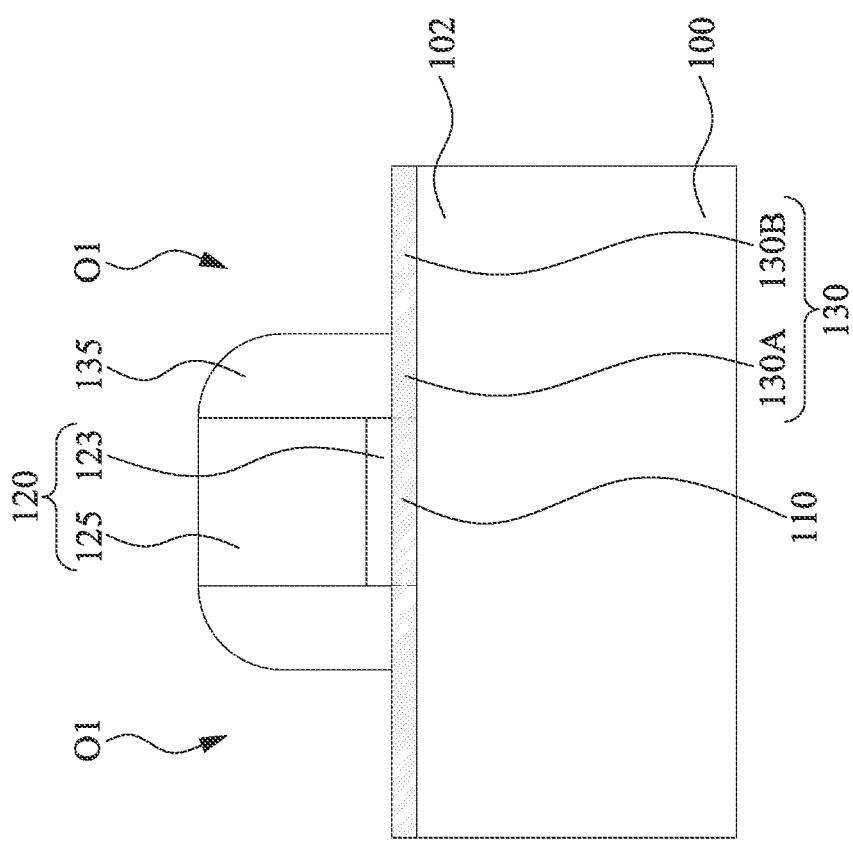

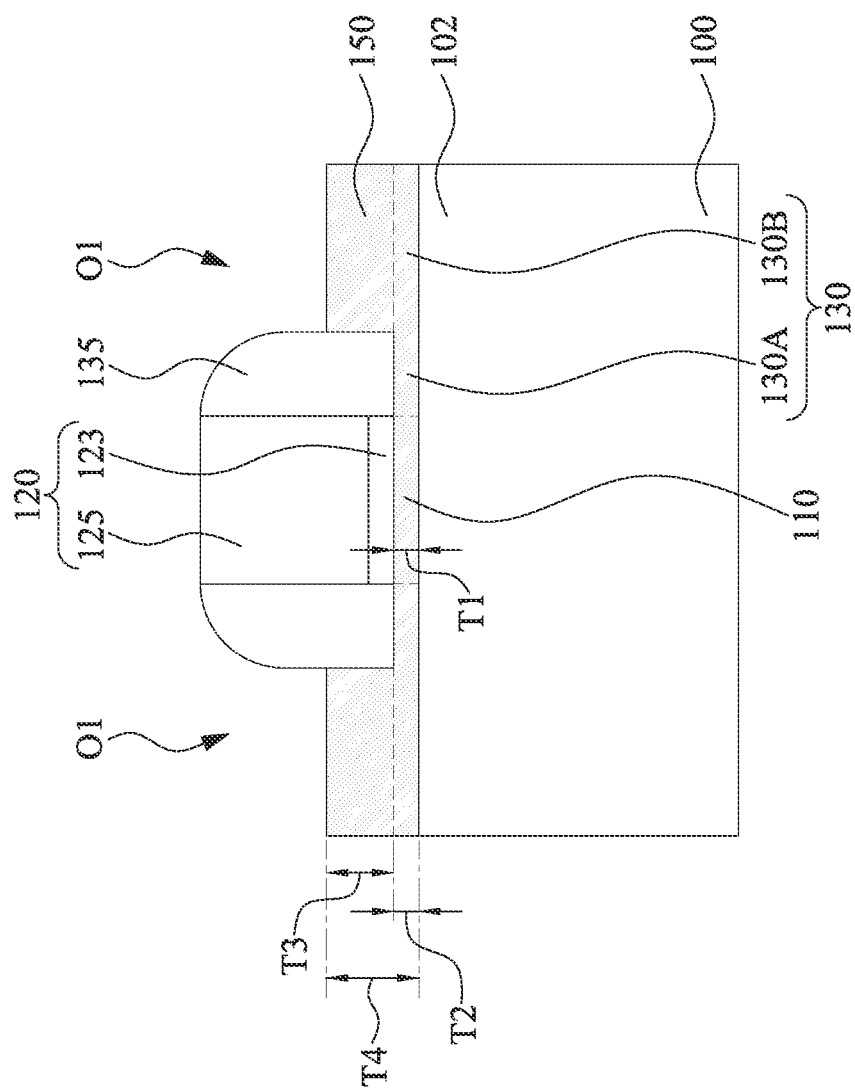

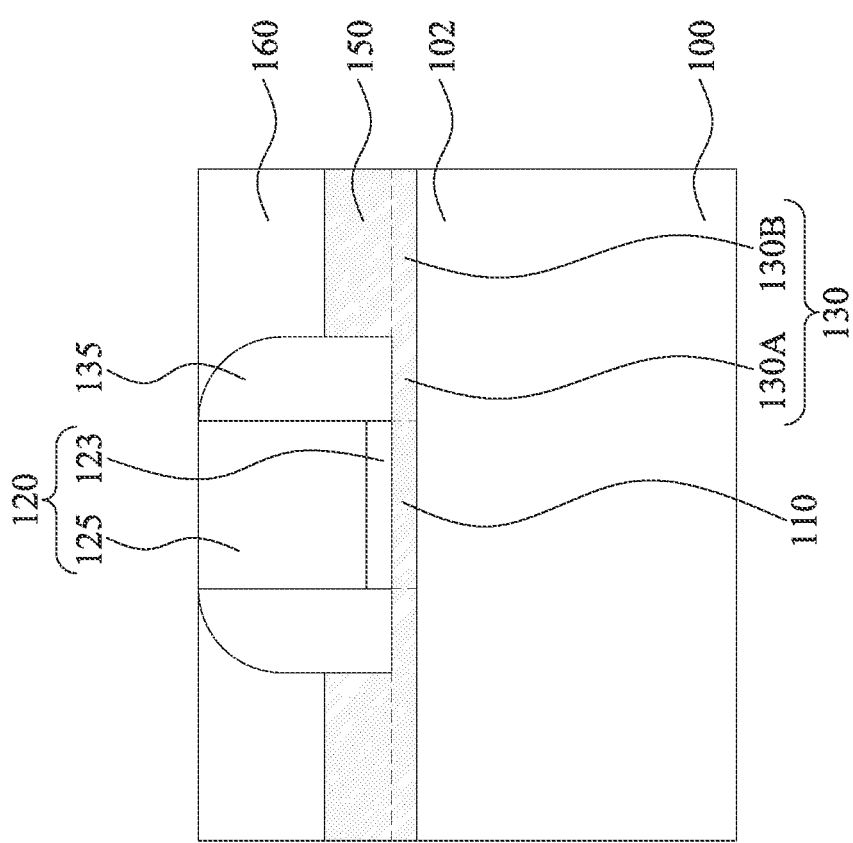

M1

- a semiconductor fin is formed over a substrate, and a plurality of isolation structures are formed over the substrate and adjacent to the semiconductor fin — S101
- a first 2D material layer, a gate dielectric layer, and a dummy gate layer are sequentially formed over the substrate — S102
- the first 2D material layer, the gate dielectric layer, and the dummy gate layer are patterned to form a patterned first 2D material layer and a dummy gate structure — S103
- a second 2D material layer is laterally grown from sidewalls of the first 2D material layer to extend along the exposed portions of the semiconductor fin and the isolation structures — S104
- a plurality of gate spacers are formed on opposite sidewalls of the dummy gate structure — S105
- a first interlayer dielectric (ILD) layer is formed adjacent to the gate spacers — S106
- the first ILD layer is patterned to form a plurality of openings exposing the second 2D material layer — S107
- a plurality of third 2D material layers are formed respectively in the openings — S108
- a second interlayer dielectric (ILD) layer is formed in the openings — S109
- the dummy gate structure is replaced with a metal gate structure — S110
- a plurality of source/drain contacts are formed in the second ILD layer — S111

Fig. 15

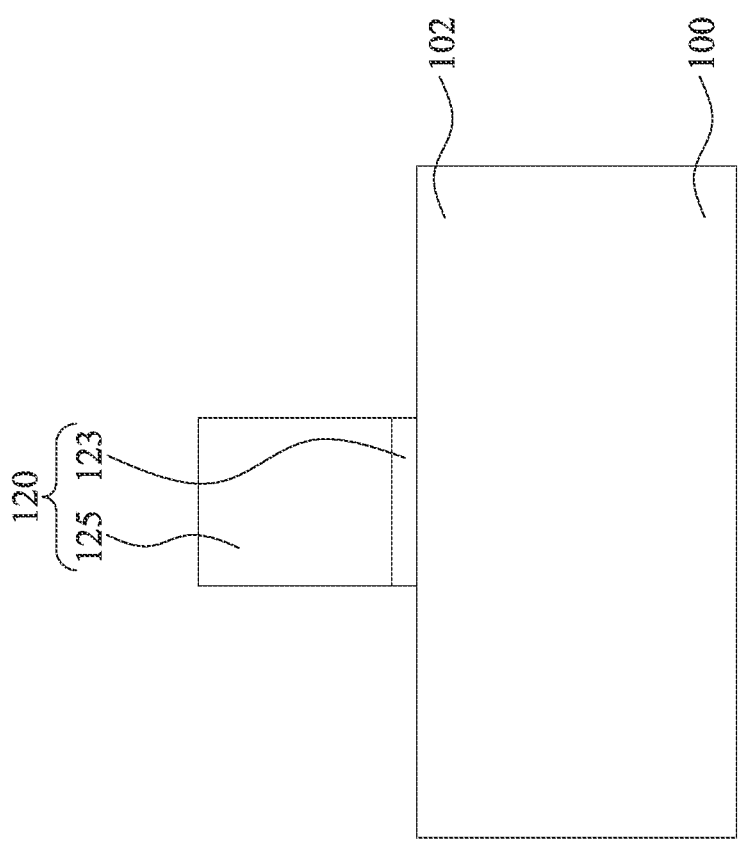

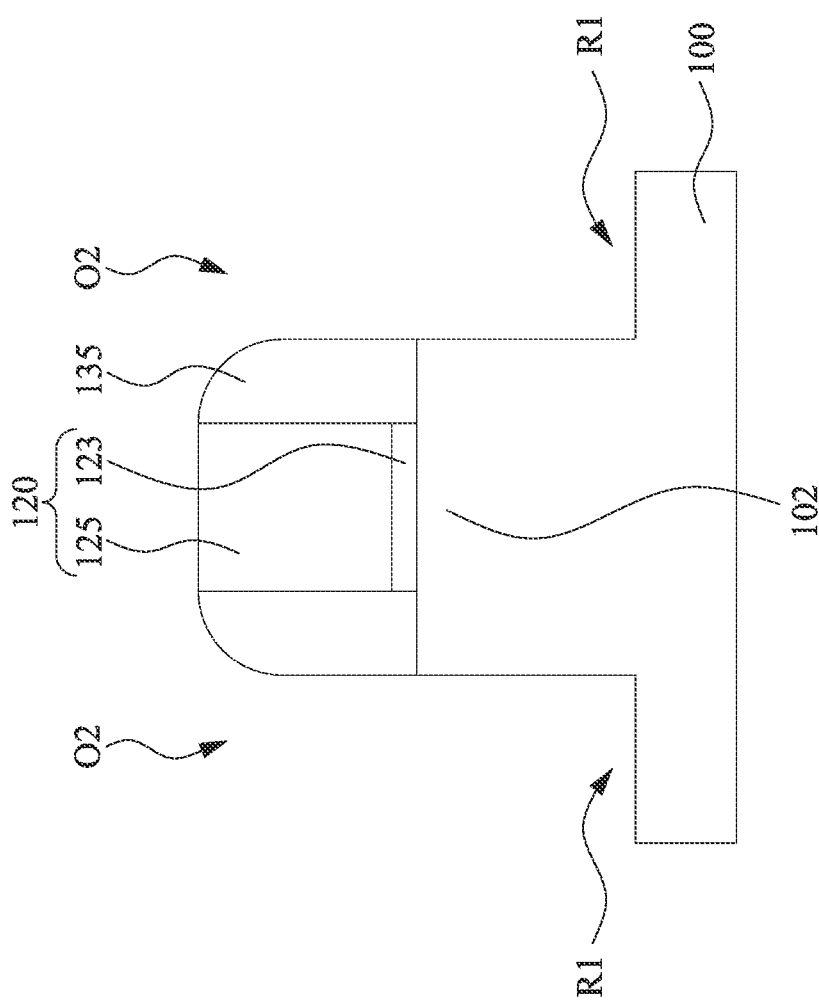

SEMICONDUCTOR DEVICE AND MANUFACTURING METHOD THEREOF

CROSS-REFERENCE TO RELATED APPLICATION

The present application is a Divisional application of U.S. application Ser. No. 16/656,210, filed on Oct. 17, 2019, now U.S. Pat. No. 11,380,785, issued on Jul. 5, 2022, which is herein incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 illustrates a method of forming a semiconductor device in accordance with some embodiments of the present disclosure.

DETAILED DESCRIPTION

Figure 1A:
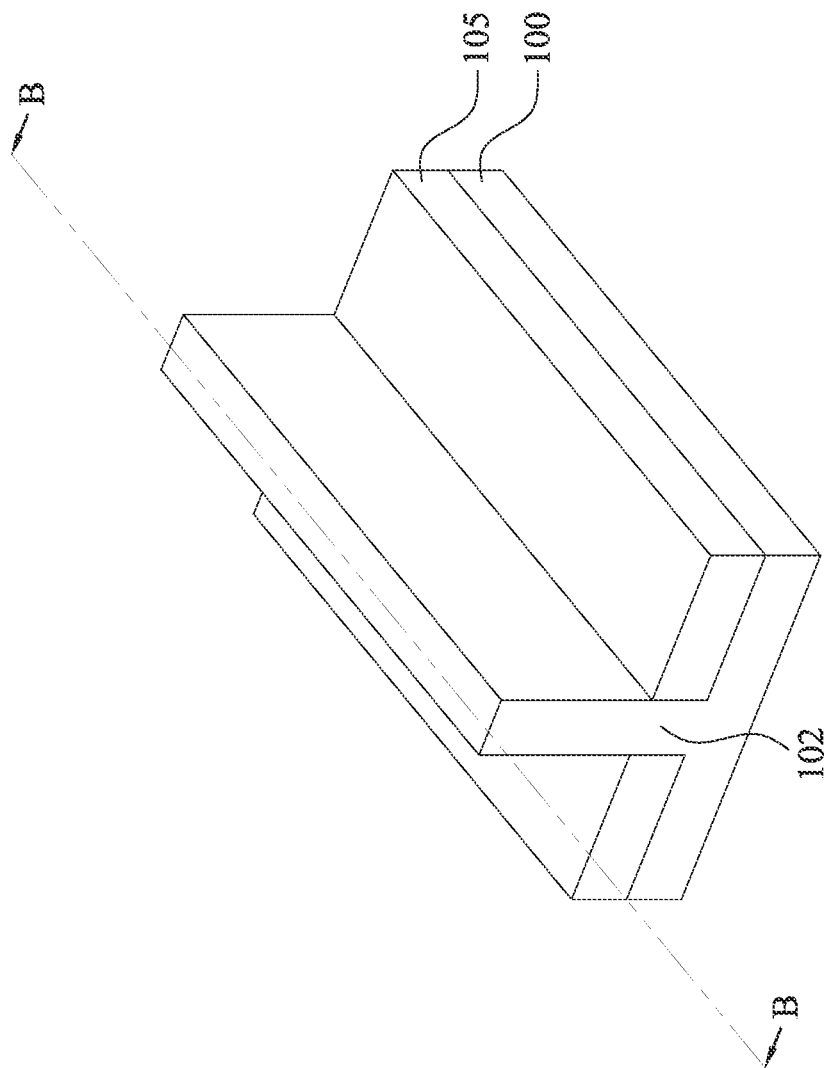
FIGS. 1A to 11B illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 11B illustrate a method for manufacturing a semiconductor device at various stages in accordance with some embodiments of the present disclosure.

Figure 1B:
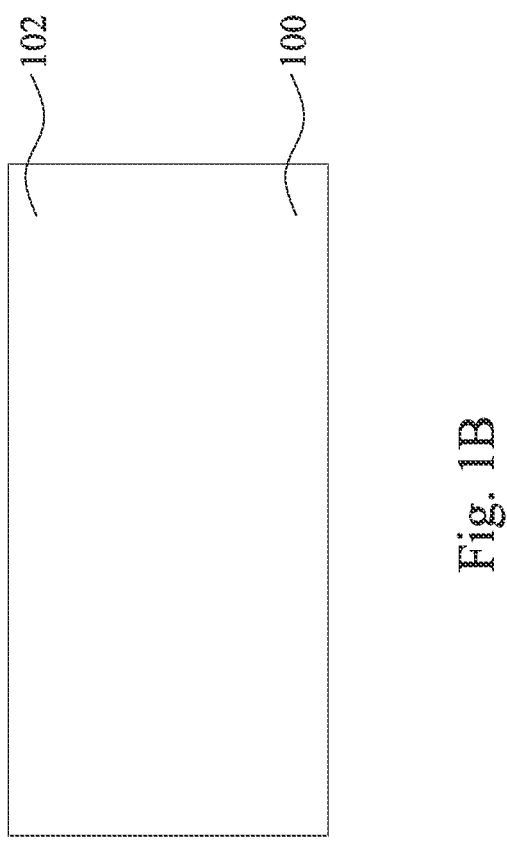

Reference is made to FIGS. 1A and 1B, in which FIG. 1B is a cross-sectional view along line B-B of FIG. 1A. A semiconductor fin 102 is formed over a substrate 100, and a plurality of isolation structures 105 are formed over the substrate 100 and adjacent to the semiconductor fin 102. In some embodiments, the substrate 100 may be a semiconductor substrate and may include a graded layer or a buried oxide, for example. In some embodiments, the substrate 100 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 100. Alternatively, the silicon substrate 100 may be an active layer of a semiconductor-on-insulator (SOI) substrate or a multi-layered structure such as a silicon-germanium layer formed on a bulk silicon layer. In some embodiments, the semiconductor material of the substrate 100 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The semiconductor fin 102 may be formed, for example, by patterning and etching the substrate 100 using photolithography techniques. In some embodiments, a layer of photoresist material (not shown) is deposited over the substrate 100. The layer of photoresist material is irradiated (exposed) in accordance with a desired pattern (the semiconductor fin 102 in this case) and developed to remove a portion of the photoresist material. The remaining photoresist material protects the underlying material from subsequent processing steps, such as etching. It is noted that other masks, such as an oxide or silicon nitride mask, may also be used in the etching process.

The isolation structures 105 act as a shallow trench isolation (STI) around the semiconductor fin 102. In some embodiments, the isolation structures 105 are made of silicon oxide, silicon nitride, silicon oxynitride, fluoride-doped silicate glass (FSG), or other low-K dielectric materials. In some embodiments, the isolation structures 105 may be formed using a high-density-plasma (HDP) chemical vapor deposition (CVD) process, using silane ($SiH_4$) and oxygen ($O_2$) as reacting precursors. In some other embodiments, the isolation structures 105 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation structures 105 may be formed using a spin-on-dielectric (SOD) process, such as hydrogen silsesquioxane (HSQ) or methyl silsesquioxane (MSQ). Other processes and materials may be used. In some embodiments, the isolation structures 105 can have a multi-layer structure, for example, a thermal oxide liner layer with silicon nitride formed over the liner. Thereafter, a thermal annealing may be optionally performed to the isolation structures 105.

Figure 2A:
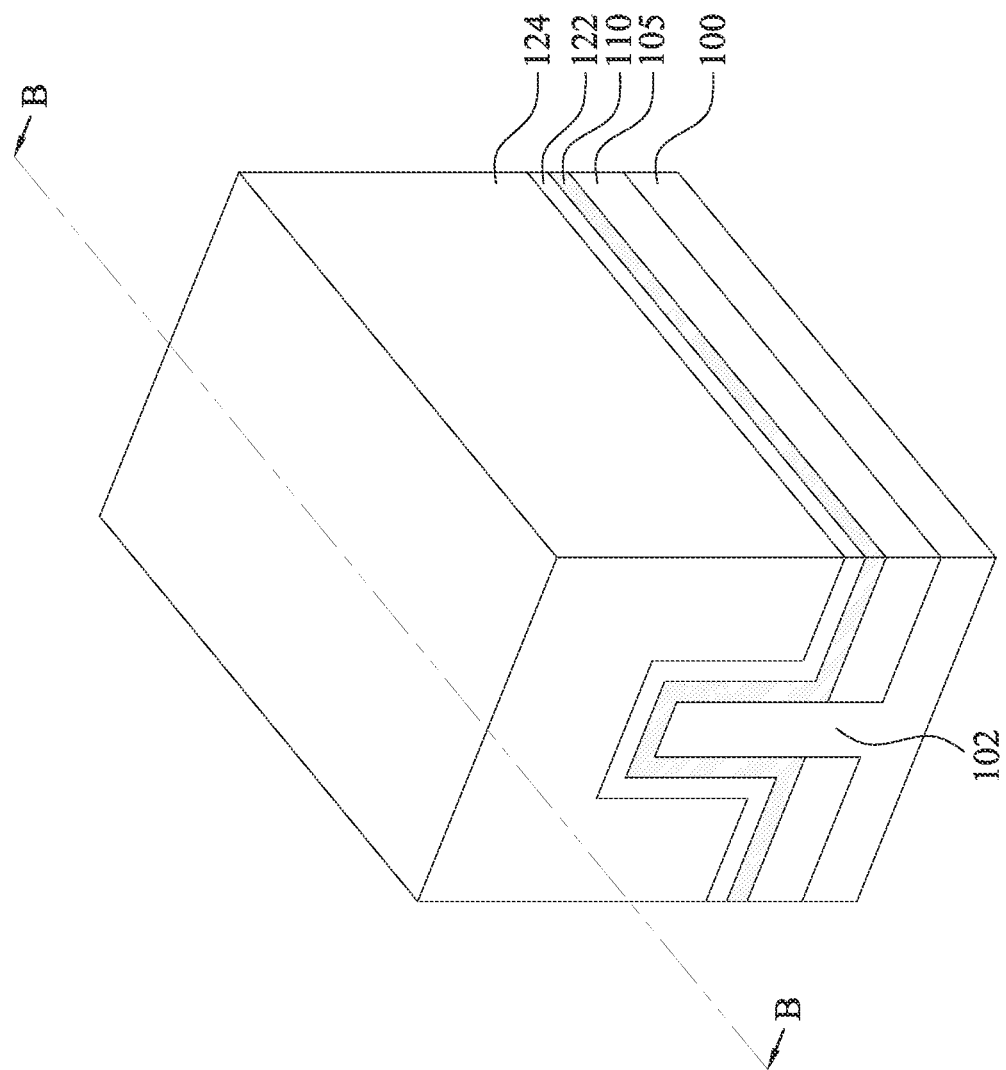
Figure 2B:
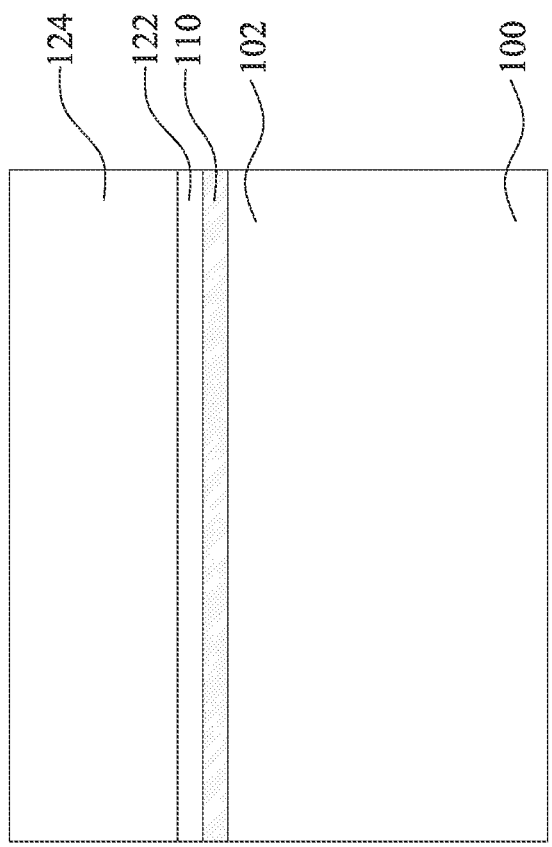

Reference is made to FIGS. 2A and 2B, in which FIG. 2B is a cross-sectional view along line B-B of FIG. 2A. A first 2D material layer 110, a gate dielectric layer 122, and a dummy gate layer 124 are sequentially formed over the substrate 100. In some embodiments, the first 2D material layer 110 extends along the semiconductor fin 102 and the isolation structures 105. As used herein, consistent with the accepted definition within solid state material art, a "2D material" refers to a crystalline material consisting of a single layer of atoms. As widely accepted in the art, "2D material" may also be referred to as a "monolayer" material. In this disclosure, "2D material" and "monolayer" material are used interchangeably without differentiation in meanings, unless specifically pointed out otherwise.

The first 2D material layer 110 may be 2D materials of suitable thickness. In some embodiments, a 2D material includes a single layer of atoms in each of its monolayer structure, so the thickness of the 2D material refers to a number of monolayers of the 2D material, which can be one monolayer or more than one monolayer. The coupling between two adjacent monolayers of 2D material includes van der Waals forces, which are weaker than the chemical bonds between/among atoms within the single monolayer.

Forming of the first 2D material layer 110 may include suitable processes depending on materials of the first 2D material layer 110 and the substrate 100. In some embodiments, the first 2D material layer 110 includes a transition metal dichacogenide (TMD) monolayer material. In some embodiments, a TMD monolayer includes one layer of transition metal atoms sandwiched between two layers of chalcogen atoms. The semiconductor fin 102 of the substrate 100 may include materials that are suitable for the formation of the TMD monolayers thereover. For example, semiconductor fin 102 of the substrate 100 may be selected based on its capacity to sustain the potential high temperature in the formation of the TMD monolayers thereover, e.g., silicon.

In some embodiment where the first 2D material layer 110 is TMD monolayers, the TMD monolayers include platinum diselenide ($PtSe_2$), with each layer of the crystal made of a two-dimensional close-packed array of Pt atoms sandwiched between Se atoms in a 1T structure. The electronic properties of the first 2D material layer, such as $PtSe_2$, may include different states of semimetal and semiconductor depending on the thickness of the layers, namely, the number of monolayers of the first 2D material layer 110.

In some embodiments, if $PtSe_2$ is a single layer structure or a bi-layer structure of 2D material, $PtSe_2$ has semiconductor properties (e.g., having a bandgap). For example, a single $PtSe_2$ monolayer is about 5.7 angstrom (Å) to about 6.3 Å in thickness (e.g., 6.0Å), and has a band gap in a range from about 1.2 eV to about 1.4 eV (e.g., 1.3 eV). On the other hand, a bi-layer $PtSe_2$ monolayers is about 1.4 nm to about 1.6 nm in thickness (e.g., 1.5 nm), and has a band gap in a range from about 0.2 eV to about 0.4 eV (e.g., 0.3 eV). Some experiments show that if the thickness of a $PtSe_2$ is lower than about 2.5 nm, the $PtSe_2$ layer has semiconductor properties. As referred to herein, a semiconductor property of a material or a semiconductor state of a material indicates that for the material or the state of the material, the Fermi level ($E_F$) lies inside a gap between a filled valence band and an empty conduction band, namely a "bandgap," and the bandgap is larger than zero and smaller than 4 electron-volt (eV).

However, if $PtSe_2$ becomes thicker, such as a tri-layer structure or more, the $PtSe_2$ will lose a bandgap and become semimetallic. For example, a tri-layer $PtSe_2$ monolayers is about 2 nm to about 3 nm in thickness (e.g., 2.5 nm), and has no band gap. As a result, if the thickness of $PtSe_2$ is greater than about 2.5 nm or has a tri-layer structure (or more), the $PtSe_2$ has semimetal properties. As used herein, a semimetal electronic property ("semimetal property") refers to an absence of a bandgap and a negligible density of states at the Fermi level. A semimetal material or a semimetal state of a material has both holes and electrons that contribute to electrical conduction and thus is conductive.

In some embodiments, because the first 2D material layer 110 of $PtSe_2$ will act as a semiconductor channel layer in the semiconductor device, the first 2D material layer 110 is less than about 2 nm to about 3 nm in thickness (e.g., 2.5 nm), namely, equal to or less than two monolayers of $PtSe_2$. In some embodiments, forming of the first 2D material layer 110 also includes treating the first 2D material layer 110 to obtain expected electronic properties (e.g., semiconductor properties in this case) of the first 2D material layer 110. The treating processes include thinning (namely, reducing the thickness of the first 2D material layer 110), doping, or straining, to make the first 2D material layer 110 exhibit certain semiconductor properties, e.g., including bandgap. For example, if the initial first 2D material layer 110 of $PtSe_2$ is thicker than about 2 nm to about 3 nm in thickness (e.g., 2.5 nm), namely equal to or more than three monolayers of $PtSe_2$ (tri-layer), the initial first 2D material layer 110 of $PtSe_2$ may exhibit semimetal properties that are unsatisfactory for acting as a channel region of a transistor. As a result, the initial first 2D material layer 110 may be thinned to obtain a first 2D material layer 110 of $PtSe_2$ having a thickness that provides semiconductor properties, such as a thickness lower than about 2.5 nm (or lower than three monolayers of $PtSe_2$). In some embodiments, plasma based dry etching, e.g., reaction-ion etching (RIE), may be used to reduce the number of monolayers of the first 2D material layer 110.

In some embodiments, the steps of making the first 2D material layer 110 having semiconductor properties can be referred to as "bandgap opening." As a 2D material may undergo transitions between and/or among semiconductor state or semimetal state, the term "bandgap opening" is used herein to refer to a state of the 2D material where a bandgap, direct or indirect, exists in the electronic state of the 2D material such that the 2D material exhibits a semiconductor property. As described herein, the semiconductor state of the first 2D material layer 110 may be obtained through one or more of selective formation, thinner/fewer number of monolayers, or other bandgap opening techniques like doping or straining.

The first 2D material layer 110 of $PtSe_2$ may be formed on the semiconductor fin 102 of the substrate 100 using suitable approaches and all are included. For example, $PtSe_2$ may be formed by deposition process over the substrate 100 or by micromechanical exfoliation and coupled over the semiconductor fin 102 of the substrate 100.

In some embodiments, the first 2D material layer 110 can be formed by molecular beam epitaxy (MBE), chemical vapor transport (CVT), chemical vapor deposition (CVD), or other suitable process. In a CVD process, $PtCl_2$ (or PtO) and selenide may be evaporated to produce Pt ions and Se ions, and the Pt ions react with the Se ions to form $PtSe_2$ deposited on the semiconductor fin 102 of the substrate 100.

In some other embodiments where $PtSe_2$ is formed by micromechanical exfoliation, the first 2D material layer 110 is formed on another substrate and then transferred to the substrate 100. For example, a 2D material film is formed on a first substrate by chemical vapor deposition (CVD), sputtering or atomic layer deposition in some embodiments. A polymer film, such as poly(methyl methacrylate) (PMMA), is subsequently formed on the 2D material film. After forming the polymer film, the sample is heated, such as by placing the sample on a hot plate. Subsequent to heating, a corner of the 2D material film is peeled off the first substrate, such as by using a tweezers, and the sample is submerged in a solution to facilitate the separation of the 2D material film from the first substrate. The 2D material film and polymer film are transferred to the substrate 100. The polymer film is then removed from the 2D material film using a suitable solvent.

The gate dielectric layer 122 may be, for example, silicon oxide, silicon nitride, a combination thereof, or the like, and may be deposited or thermally grown according to acceptable techniques. The gate dielectric layer 122 may be formed by suitable process, such as chemical vapor deposition (CVD), physical vapor deposition (PVD), atomic layer deposition (ALD), or any suitable process.

The dummy gate layer 124 may be deposited over the gate dielectric layer 122 and then planarized, such as by a CMP. The dummy gate layer 124 may include polycrystalline-silicon (poly-Si) or poly-crystalline silicon-germanium (poly-SiGe). Further, the dummy gate layer 124 may be doped poly-silicon with uniform or non-uniform doping. The dummy gate layer 124 may be formed by suitable process, such as chemical vapor deposition (CVD), physical vapor deposition (PVD), atomic layer deposition (ALD), or any suitable process.

Figure 3A:
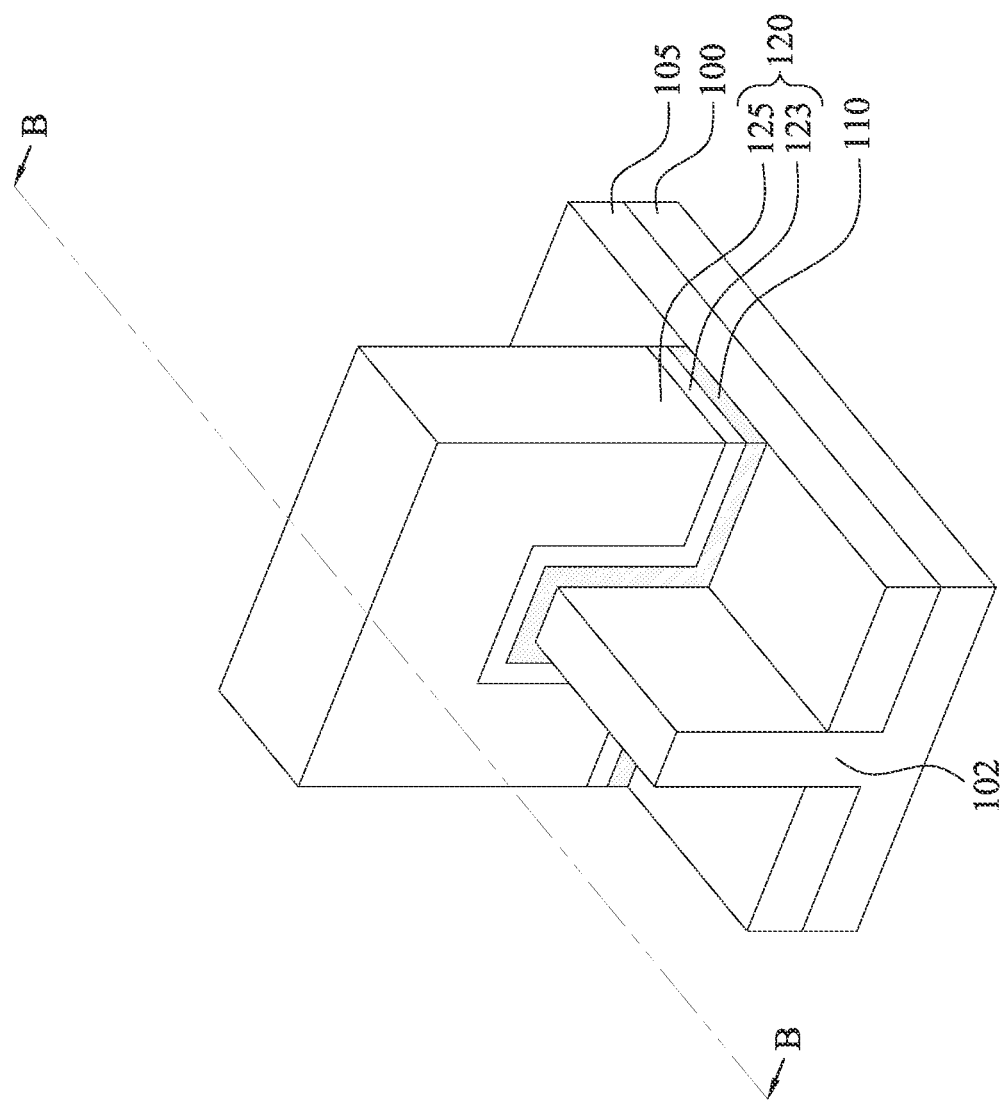
Figure 3B:
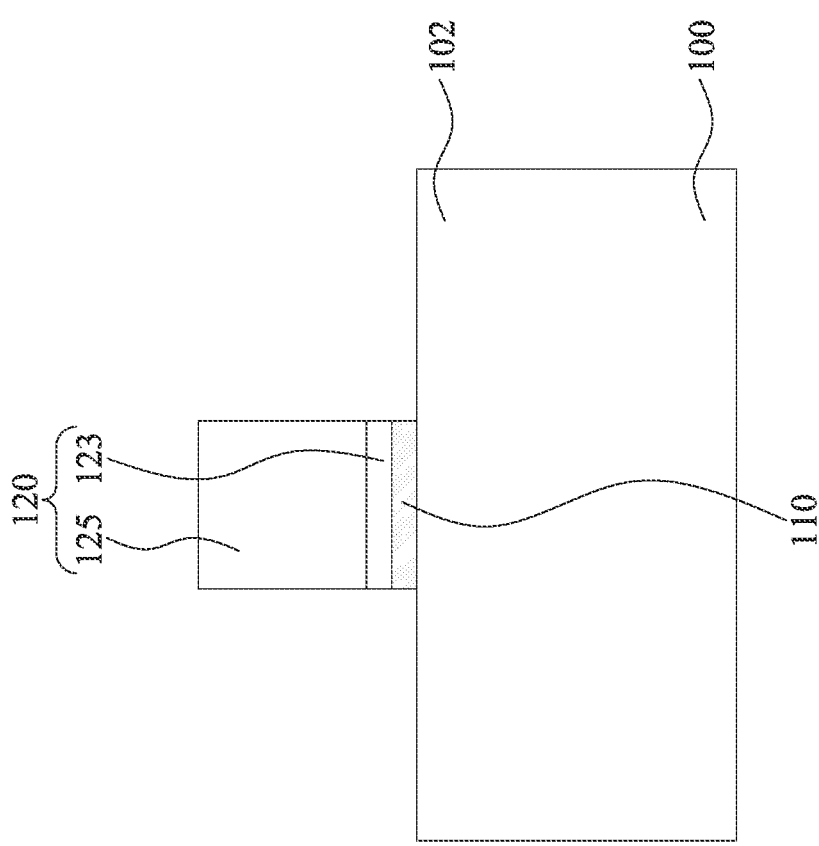

Reference is made to FIGS. 3A and 3B, in which FIG. 3B is a cross-sectional view along line B-B of FIG. 3A. The first 2D material layer 110, the gate dielectric layer 122, and the dummy gate layer 124 are patterned to form a patterned first 2D material layer 110, a gate dielectric 123, and a dummy gate 125, such that portions of the semiconductor fin 102 and isolation structures 105 are exposed. The gate dielectric 123 and the dummy gate 125 can be collectively referred to as dummy gate structure 120 or dummy gate stack 120. After the patterning, portions of the semiconductor fin 102 and portions of the isolation structures 105 are exposed by the dummy gate structure 120. In some embodiments, opposite sidewalls of the patterned first 2D material layer 110 are exposed.

In some embodiments, the first 2D material layer 110, the gate dielectric layer 122, and the dummy gate layer 124 may be patterned using photolithography techniques. In some embodiments, a layer of photoresist material (not shown) is deposited over the dummy gate layer 124. The layer of photoresist material is irradiated (exposed) in accordance with a desired pattern (the dummy gate structure 120 in this case) and developed to remove a portion of the photoresist material. The remaining photoresist material protects the underlying material from subsequent processing steps, such as etching.

Figure 4A:
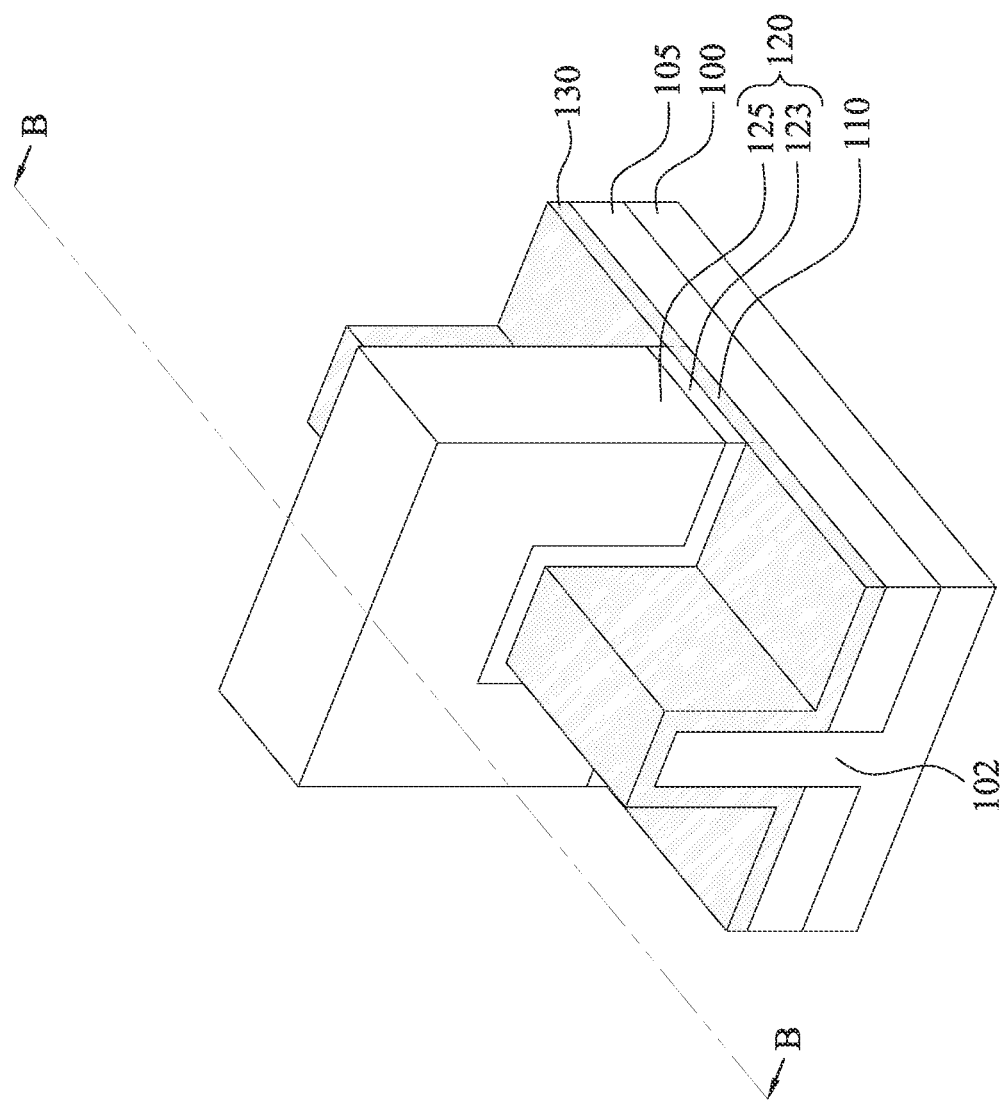

Reference is made to FIGS. 4A and 4B, in which FIG. 4B is a cross-sectional view along line B-B of FIG. 4A. A second 2D material layer 130 is formed on the exposed portions of the semiconductor fin 102 and the isolation structures 105. In some embodiments, the second 2D material layer 130 is laterally grown from the first 2D material 110 along the exposed surfaces of the semiconductor fin 102 and the isolation structures 105. As such, the bottom surface of the first 2D material layer 110 and the bottom surface of the second 2D material layer 130 are coterminous. In some embodiments, the second 2D material layer 130 and the first 2D material layer 110 include the same material, such as $PtSe_2$. Because the first 2D material layer 110 is formed along the surfaces of the semiconductor fin 102 and the isolation structures 105, the chemical bonds between/among atoms within the single monolayer of the first 2D material layer 110 are substantially parallel to the surfaces of the semiconductor fin 102 and the isolation structures 105. Moreover, since the sidewalls of first 2D material layer 110 are exposed by the dummy gate structure 120, the atoms of the second 2D material layer 130 tend to bond with the chemical bonds on sidewalls of the first 2D material layer 110, so that the second 2D material 130 is laterally grown from sidewalls of the first 2D material layer 110. Stated another way, the second 2D material layer 130 is horizontally grown from the exposed sidewalls of the first 2D material layer 110 by using the first 2D material layer 110 as a base layer. In some embodiments, the second 2D material layer 130 can be formed by molecular beam epitaxy (MBE), chemical vapor transport (CVT), chemical vapor deposition (CVD), or other suitable process.

As mentioned above, because the second 2D material layer 130 is formed by using the first 2D material layer 110 as a base layer, the second 2D material layer 130 and the first 2D material layer 110 have substantially the same thickness as the first 2D material layer 110. For example, if the first 2D material layer 110 is a single layer monolayer, the second 2D material layer 130 may also be a single layer monolayer, and may have a thickness in a range from about 5.7 angstrom (A) to about 6.3 Å (e.g., 6.0 Å). On the other hand, if the first 2D material layer 110 is bi-layer monolayers, the second 2D material layer 130 may also be bi-layer monolayers, and may have a thickness in a range from 1.4 nm to about 1.6 nm (e.g., 1.5 nm). Generally, the thickness of the second 2D material layer 130 is lower than 2.5 nm, such that the second 2D material layer 130 (e.g., $PtSe_2$) has semiconductor properties. In some embodiments where the first and second 2D material layers 110 and 130 are formed of a same material (e.g., PtSe$_2$), there may be no distinguishable interface formed therebetween. In some embodiments where the second 2D material layer 130 is formed of a material different than the first 2D material layer 110, there may be a distinguishable interface formed therebetween.

Figure 5A:
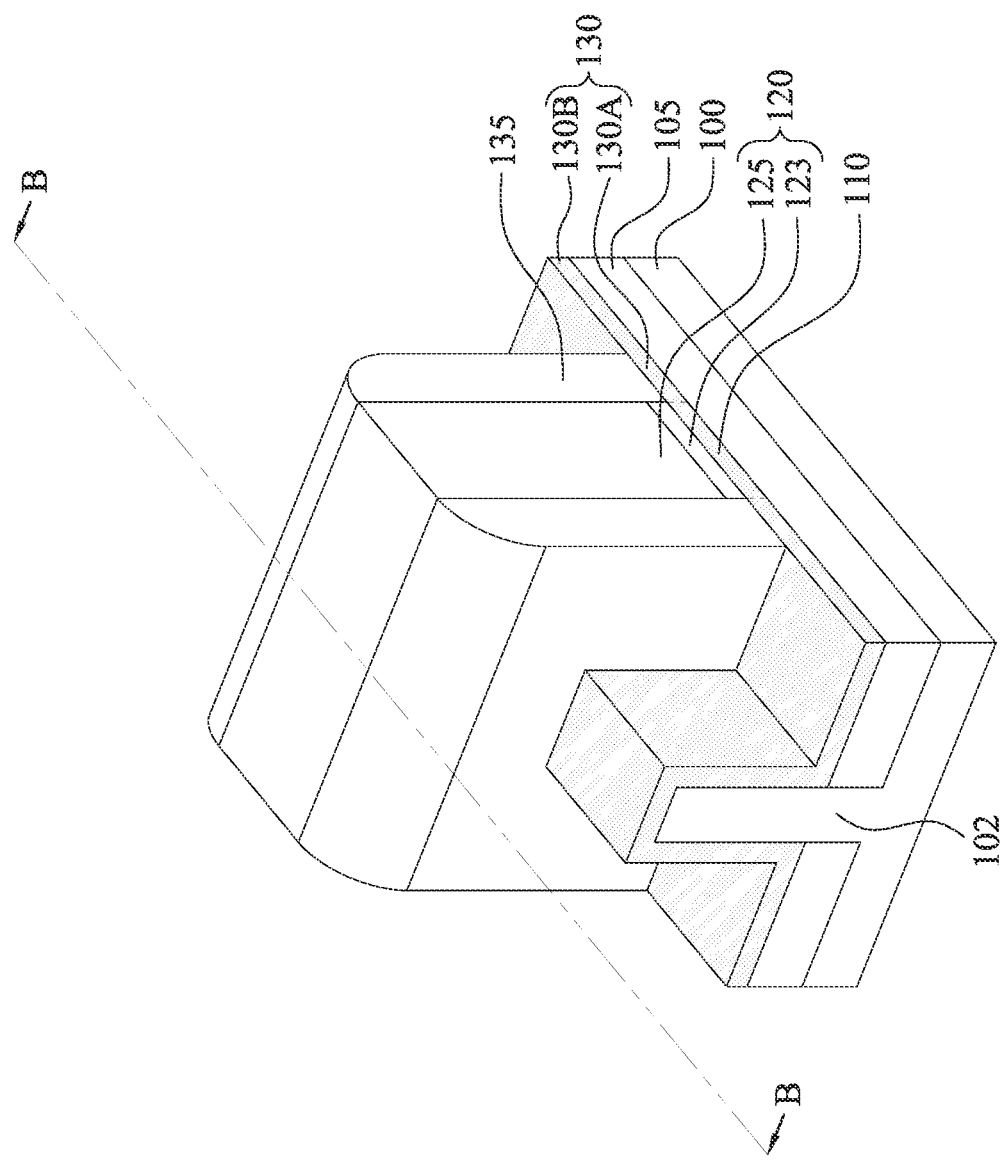
Figure 5B:
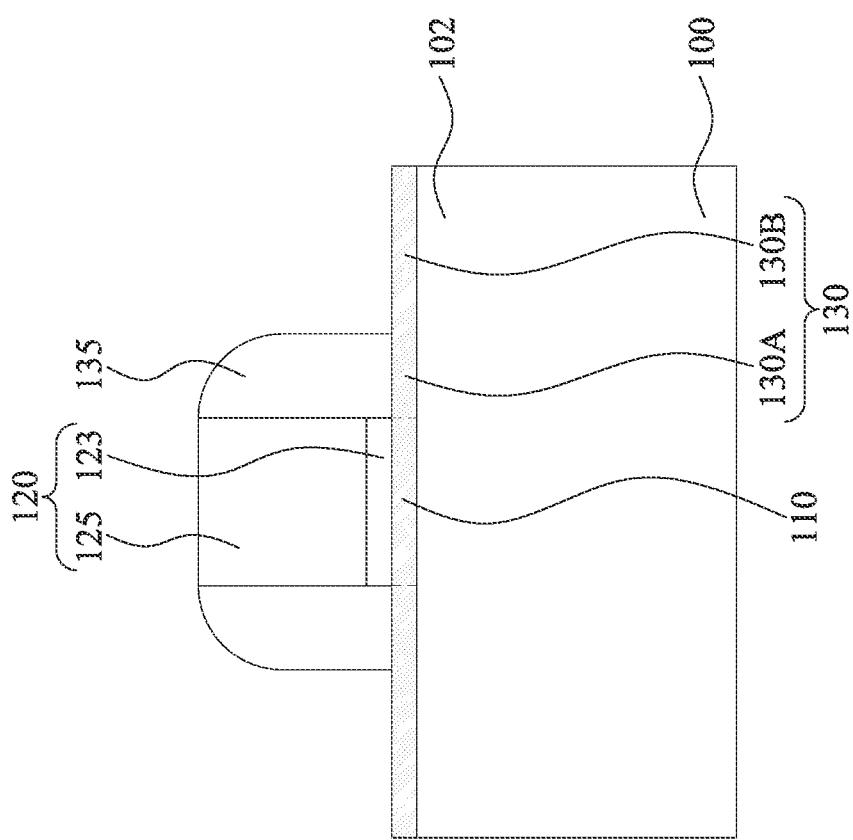

Reference is made to FIGS. 5A and 5B, in which FIG. 5B is a cross-sectional view along line B-B of FIG. 5A. A plurality of gate spacers 135 are formed on opposite sidewalls of the dummy gate structure 120. In some embodiments, the gate spacers cover a first portion 130A of the second 2D material layer 130, while leaving a second portion 130B of the second 2D material layer 130 exposed. The gate spacers 135 may be formed by, for example, depositing a spacer layer blanket over the dummy gate structure 120 and the second 2D material layer 130, and followed by an etching process to remove horizontal portions of the spacer layer, such that vertical portions of the spacer layer remain on sidewalls of the dummy gate structure 120 and the second 2D material layer 130. In some embodiments, the gate spacers 135 may include SiO$_2$, Si$_3$N$_4$, SiO$_x$N$_y$, SiC, SiCN films, SiOC, SiOCN films, and/or combinations thereof. In some embodiments, each of the gate spacers 135 includes multiple layers, such as main spacer walls, liner layers, and the like. In some embodiments, the gate spacers 135 may be formed by CVD, SACVD, flowable CVD, ALD, PVD, or other suitable process.

Figure 6A:
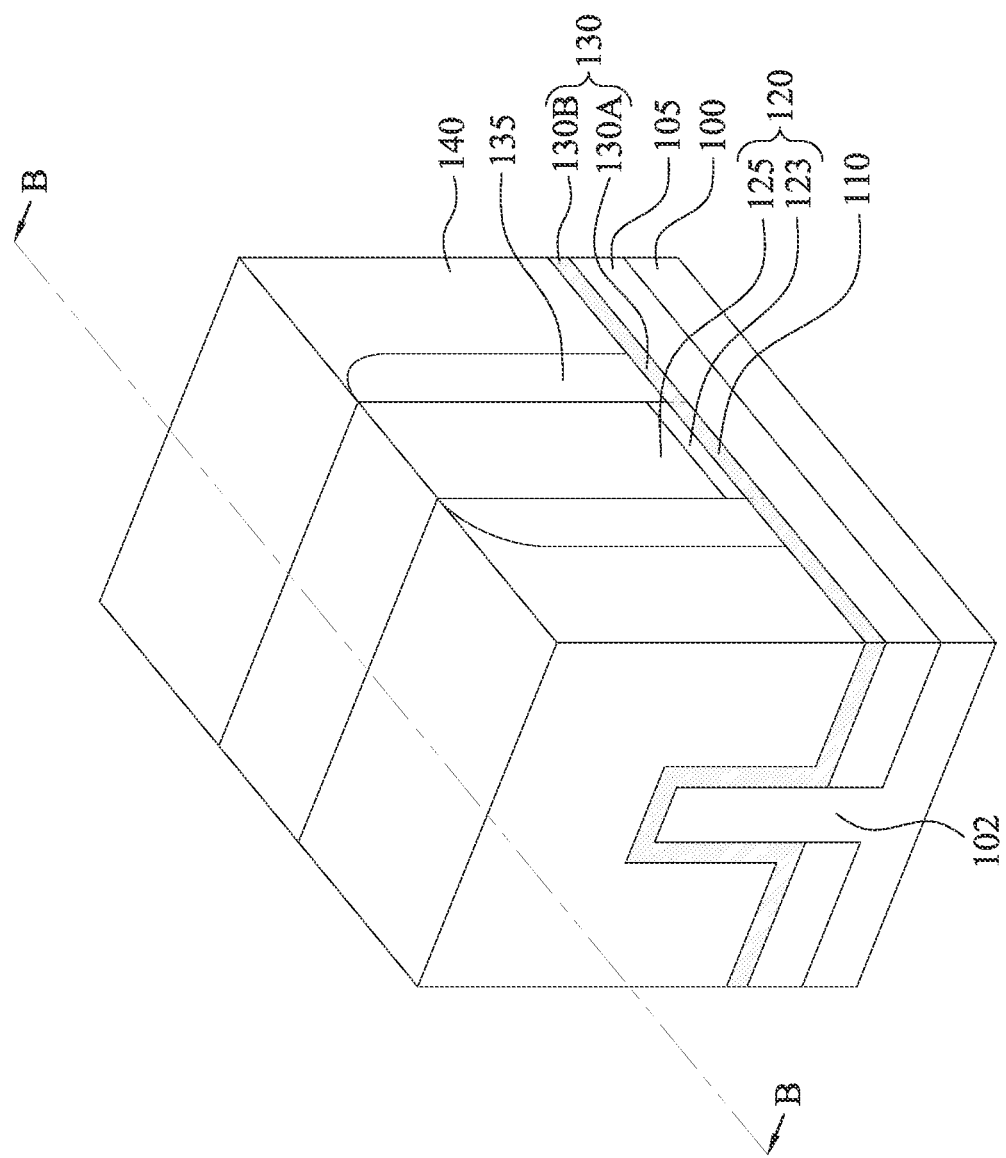
Figure 6B:
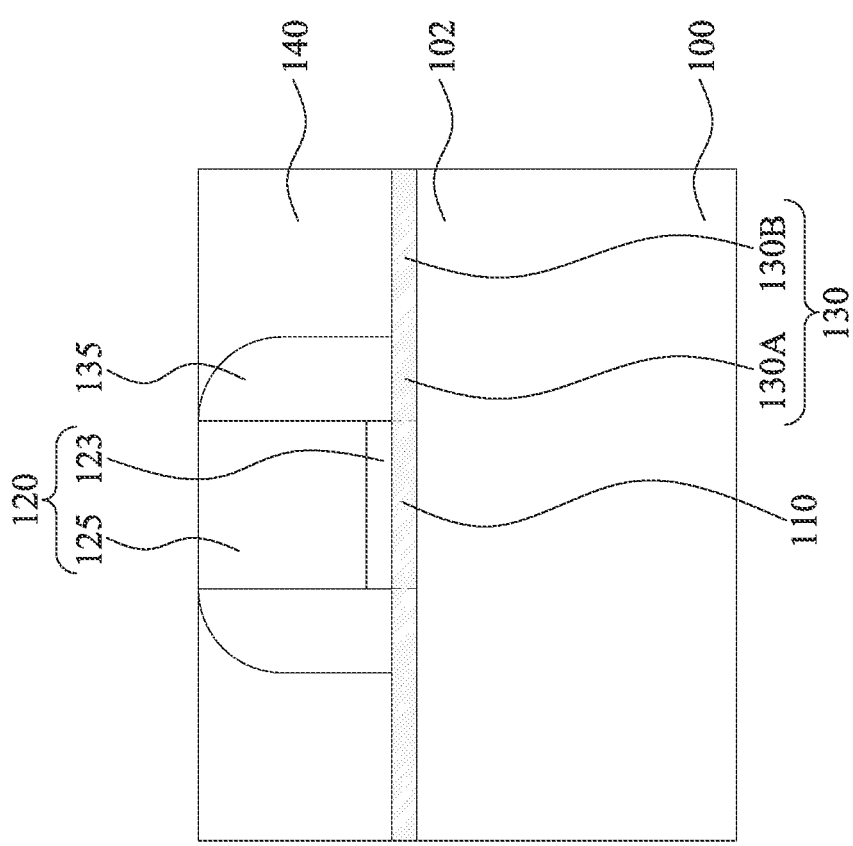

Reference is made to FIGS. 6A and 6B, in which FIG. 6B is a cross-sectional view along line B-B of FIG. 6A. An interlayer dielectric (ILD) layer 140 is formed adjacent to the gate spacers 135. The ILD layer 140 extends along the second portion 130B of the second 2D material layer 130. In some embodiments, a dielectric layer is deposited blanket over the substrate 100 and filling the spaces adjacent to the gate spacers 135, and followed by a CMP process to remove excessive material of the dielectric layer until the top surface of the dummy gate structure 120 is exposed. In some embodiments, the ILD layer 140 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 140 may be formed using, for example, CVD, ALD, spin-on-glass (SOG) or other suitable techniques.

Figure 7A:
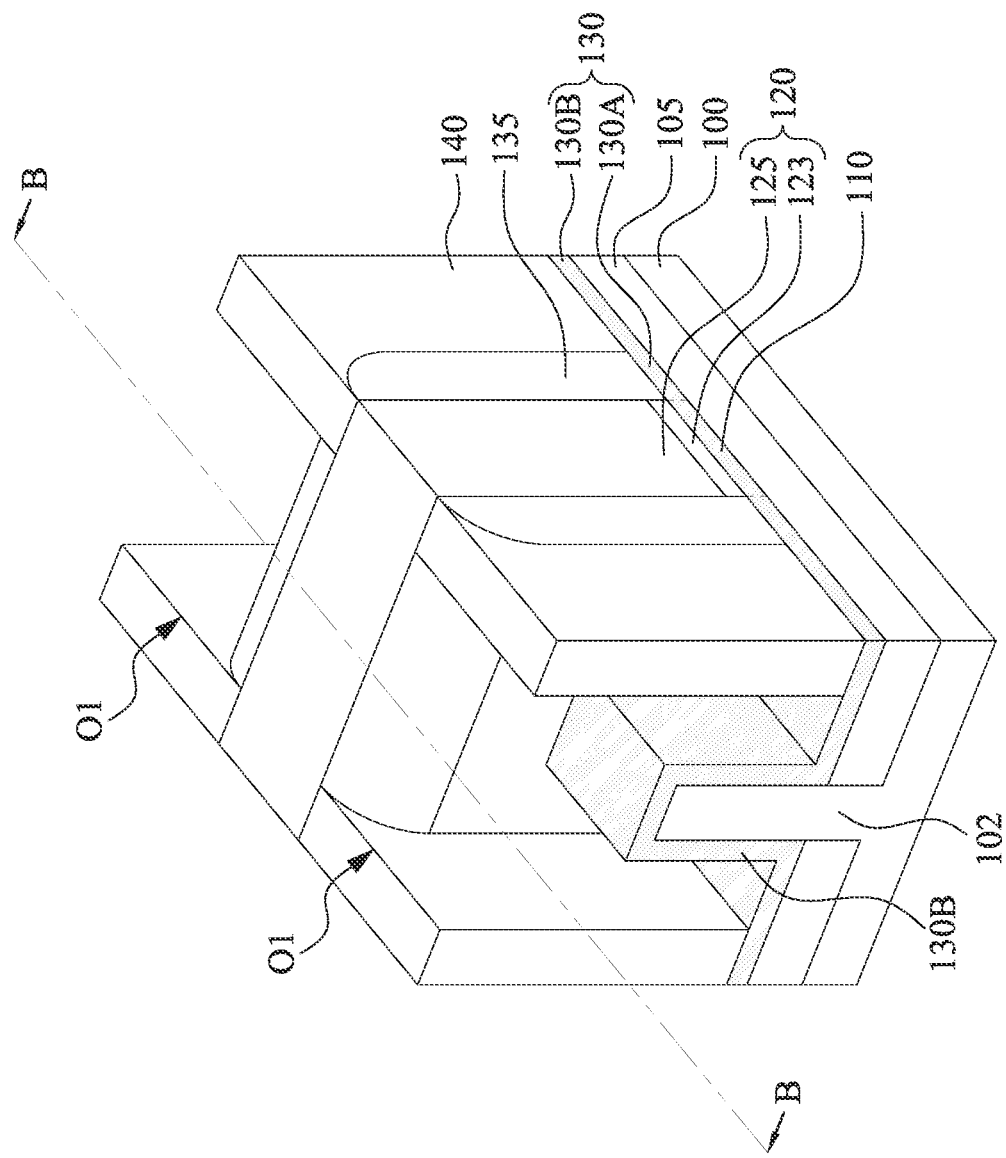

Reference is made to FIGS. 7A and 7B, in which FIG. 7B is a cross-sectional view along line B-B of FIG. 7A. The ILD layer 140 is patterned to form a plurality of first openings O1 exposing the second 2D material layer 130. In greater detail, the openings O1 expose the second portion 130B of the second 2D material layer 130. In some embodiments, the ILD layer 140 may be patterned using photolithography techniques. In some embodiments, a layer of photoresist material (not shown) is deposited over the substrate 100. The layer of photoresist material is irradiated (exposed) in accordance with a desired pattern and developed to remove a portion of the photoresist material. The remaining photoresist material protects the underlying material from subsequent processing steps, such as etching. It is noted that other masks, such as an oxide or silicon nitride mask, may also be used in the etching process.

Figure 8A:
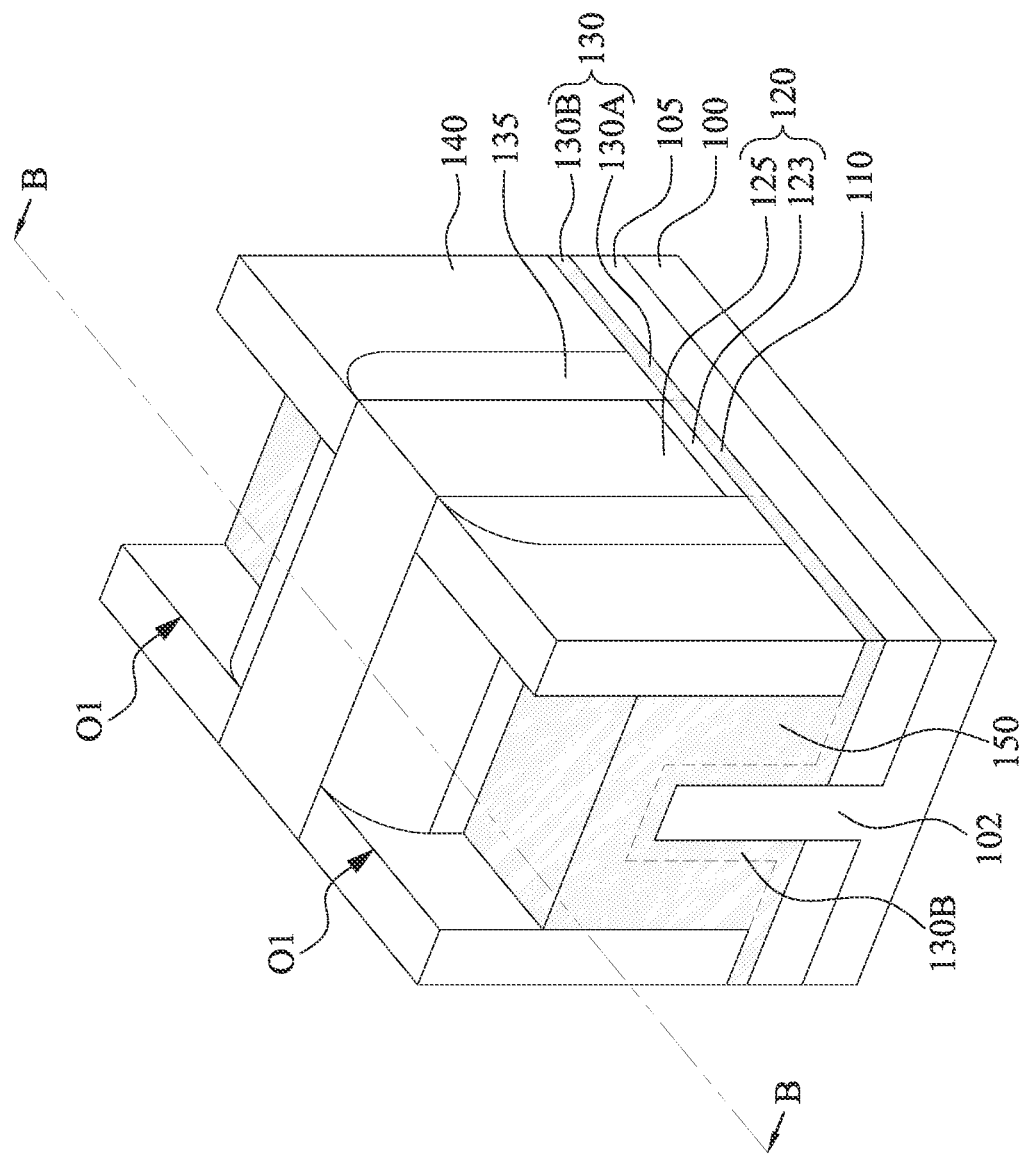

Reference is made to FIGS. 8A and 8B, in which FIG. 8B is a cross-sectional view along line B-B of FIG. 8A. A plurality of third 2D material layers 150 are formed respectively in the first openings O1. In some embodiments, the third 2D material layer 150 can be formed by molecular beam epitaxy (MBE), chemical vapor transport (CVT), chemical vapor deposition (CVD), or other suitable process. In some embodiments, a 2D material tends to be formed on 2D material surface rather than on a 3D crystalline surface. Accordingly, the third 2D material layers 150 tend to form on the exposed surface of the second portion 130B of the second 2D material layer 130 rather than the structures having 3D crystalline structure, such as the ILD layer 140, the gate spacers 135, and the dummy gate structure 120. Stated another way, the third 2D material layers 150 has a higher growing rate (e.g., deposition rate) on the exposed surface of the second portion 130B of the second 2D material layer 130 than on the ILD layer 140, the gate spacers 135, and the dummy gate structure 120. Here, the term "3D crystalline structure" indicates a structure has regular arrangements of atoms in three dimensions represented by a repeated three dimensions unit cell, in which the unit cell is the smallest repeating unit showing the full symmetry of the crystalline structure. In some embodiments, the first 2D material layer 110, the second 2D material layer 130, and the third 2D material layers 150 include the same material, such as PtSe$_2$.

As illustrated in FIG. 8B, in some embodiments where the first 2D material layer 110, the second 2D material layer 130, and the third 2D material layers 150 are made of PtSe$_2$, the first 2D material layer 110 has a thickness T1, the second 2D material layer 130 has a thickness T2, and each of the third 2D material layers 150 has a thickness T3. As mentioned above, the thickness T1 of the first 2D material layer 110 is lower than about 2.5 nm, namely equal to or less than two monolayers of PtSe$_2$, such that the first 2D material layer 110 has semiconductor properties. Similarly, the thickness T2 of the second 2D material layer 130 is lower than about 2.5 nm. However, the third 2D material layers 150 having the thickness T3 are formed on the second portion 130B of the second 2D material layer 130, such that the total thickness T4 of the second portion 130B of the second 2D material layer 130 and the third 2D material layers 150 is greater than about 2.5 nm, which will make the combination of the second portion 130B of the second 2D material layer 130 and the third 2D material layers 150 become semimetallic. Combination of the third 2D material layers 150 and the underlying second portion 130B of the second 2D material layer 130 can act as source/drain structures of a transistor. In this way, un-doped semimetallic source/drain structures, instead of typical n-doped or p-doped semiconductor source/drain structures, can be formed. On the other hand, the first portion 130A of the second 2D material layer 130 under the gate spacers 135 still remain semiconductor properties, because the first portion 130A of the second 2D material layer 130 remains the thickness T2 lower than about 2.5 nm.

In some embodiments, the third 2D material layers 150 are formed to have sufficient thickness T3 to make sure the combination of the third 2D material layers 150 and the underlying second portion 130B of the second 2D material layer 130 having semimetal properties. Stated another way, the third 2D material layers 150 are formed to have the thickness T3, such that the sum of thicknesses T2 and T3 is greater than about 2.5 nm. Because the second and third 2D material layers 130 and 150 are formed of a same material (e.g., PtSe$_2$), there may be no distinguishable interface formed therebetween.

Figure 9A:
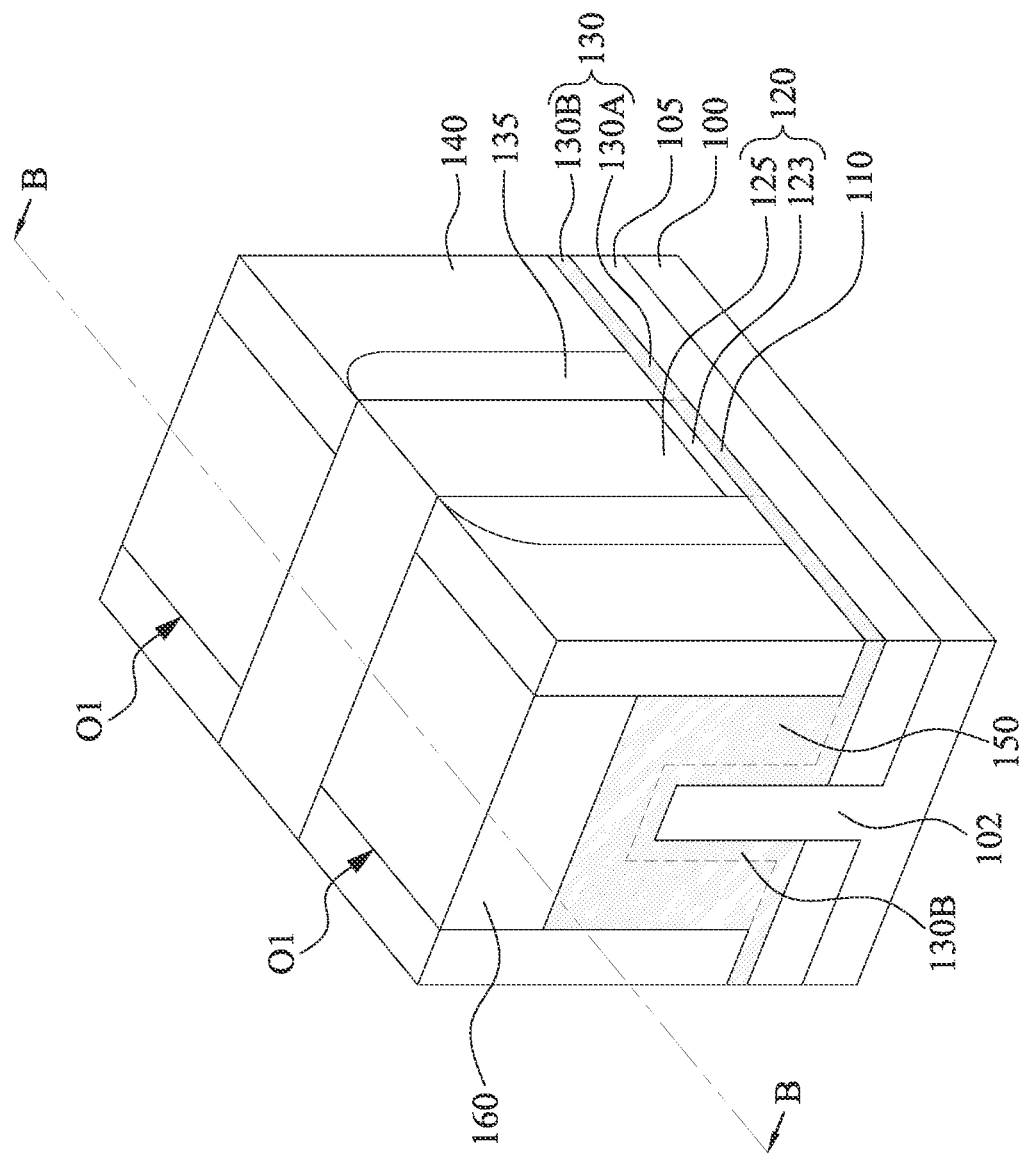

Reference is made to FIGS. 9A and 9B, in which FIG. 9B is a cross-sectional view along line B-B of FIG. 9A. An interlayer dielectric (ILD) layer 160 is formed in the first openings O1. The ILD layer 160 extends along the third 2D material layers 150. In some embodiments, a dielectric layer is deposited blanket over the substrate 100 and filling the first openings O1, followed by a CMP process to remove excessive material of the dielectric layer until the top surface of the dummy gate structure 120 is exposed. In some embodiments, the ILD layer 160 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 160 may be formed using, for example, CVD, ALD, spin-on-glass (SOG) or other suitable techniques.

Figure 10A:
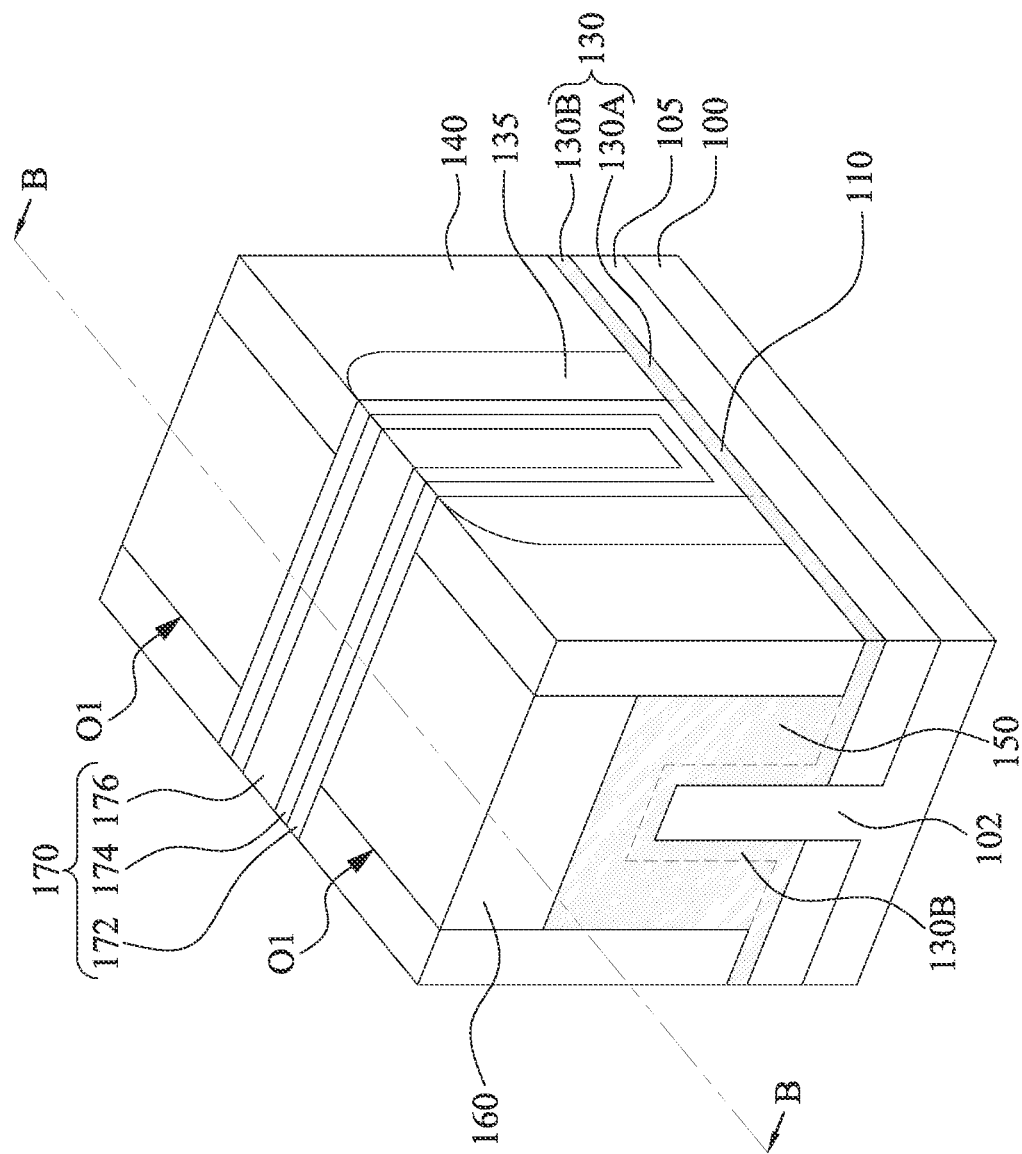
Figure 10B:
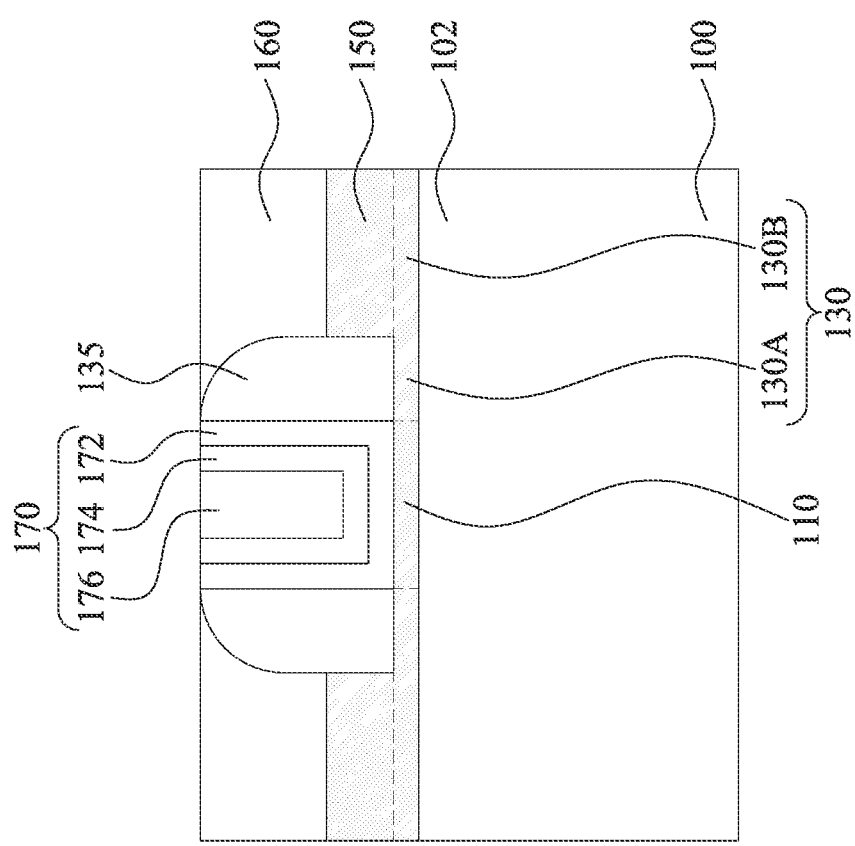

Reference is made to FIGS. 10A and 10B, in which FIG. 10B is a cross-sectional view along line B-B of FIG. 10A. The dummy gate structure 120 is replaced with a metal gate structure 170. In some embodiments, the metal gate structure 170 includes a gate dielectric layer 172, a work function metal layer 174 over the gate dielectric layer 172, and a gate electrode 176 over the work function metal layer 174. In some embodiments, the metal gate structure 170 may be formed by, for example, removing the dummy gate structure 120 to form a gate trench between the gate spacers 135, sequentially depositing a gate dielectric material, a work function metal material, and a gate electrode material in the trenches, and followed by a CMP process to remove excessive gate dielectric material, work function metal material, and gate electrode material until the top surface of the ILD layer 160 is exposed to form the metal gate structure 170.

In some embodiments, the gate dielectric layer 172 may include high-k dielectrics, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable material. In some embodiments, the work function metal layer 174 may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the gate electrode 176 may include tungsten (W). In some other embodiments, the gate electrode 176 includes aluminum (Al), copper (Cu) or other suitable conductive material.

Figure 11A:
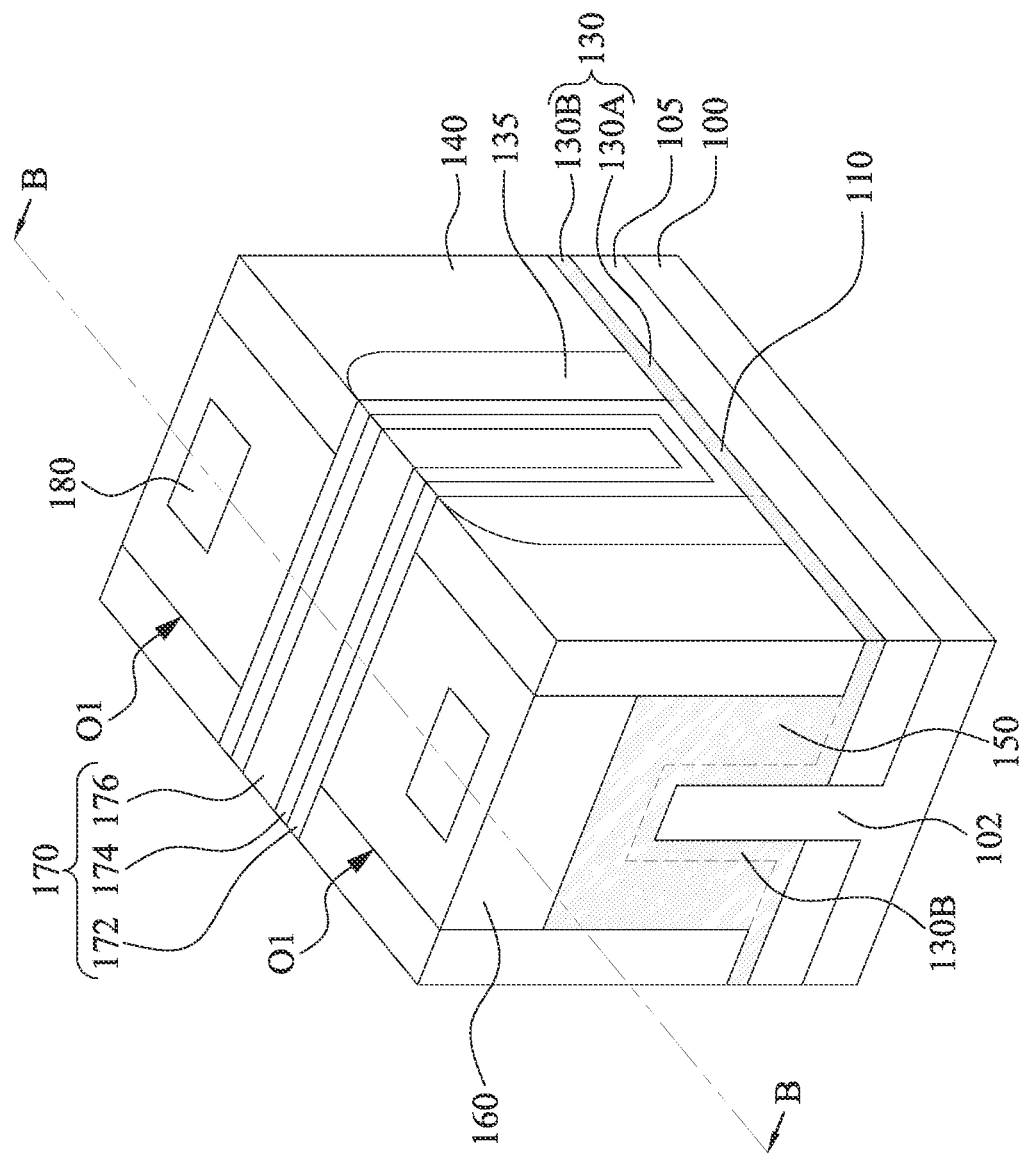
Figure 11B:
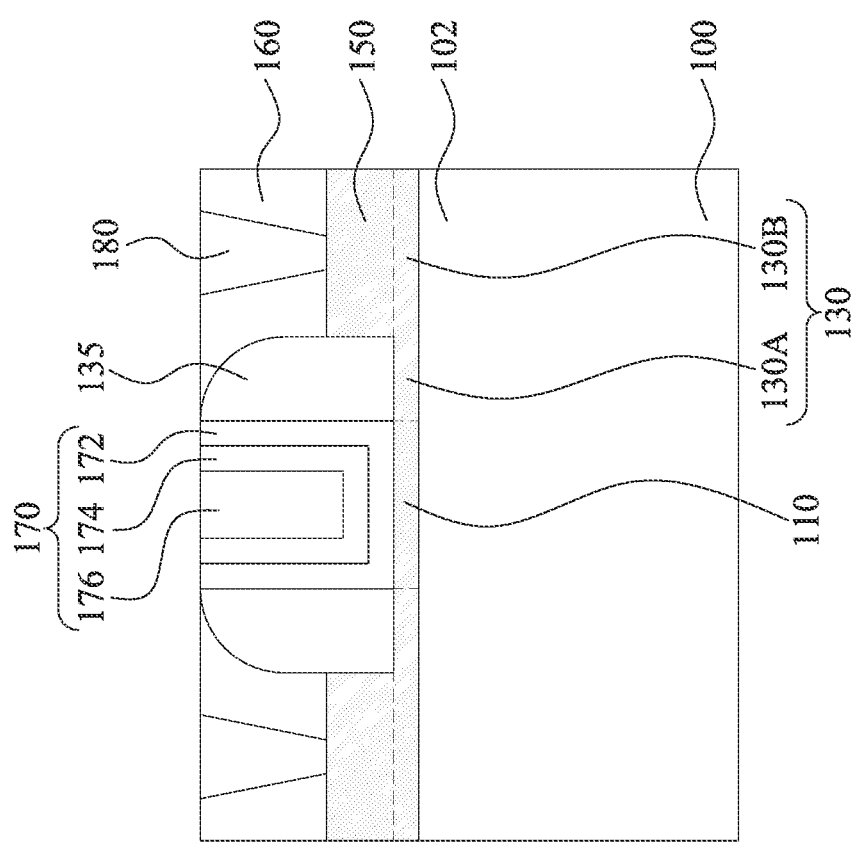

Reference is made to FIGS. 11A and 11B, in which FIG. 11B is a cross-sectional view along line B-B of FIG. 11A. A plurality of source/drain contacts 180 are formed in the ILD layer 160. In some embodiments, the source/drain contact 180 includes a liner and a plug. The liner is between plug and the underlying source/drain structure (e.g., the third 2D material layer 150 and the second portion 130B of the second 2D material layer 130). In some embodiments, the liner assists with the deposition of plug and helps to reduce out-diffusion of a metal material of plug. In some embodiments, the liner includes titanium (Ti), titanium nitride (TiN), tantalum (Ta), tantalum nitride (TaN), or another suitable material. The Plug includes a conductive material, such tungsten (W), copper (Cu), aluminum (Al), ruthenium (Ru), cobalt (Co), molybdenum (Mo), nickel (Ni), or other suitable conductive material. The source/drain contacts 180 are may be formed by, for example, patterning the ILD layer 160 to form a plurality of openings that define the positions of the source/drain contacts 180, filling conductive material in the openings, followed by a CMP process to remove excessive conductive material. In some embodiments, the source/drain contacts 180 may be formed by PVD, CVD, ALD, or other suitable processes.

Figure 12A:
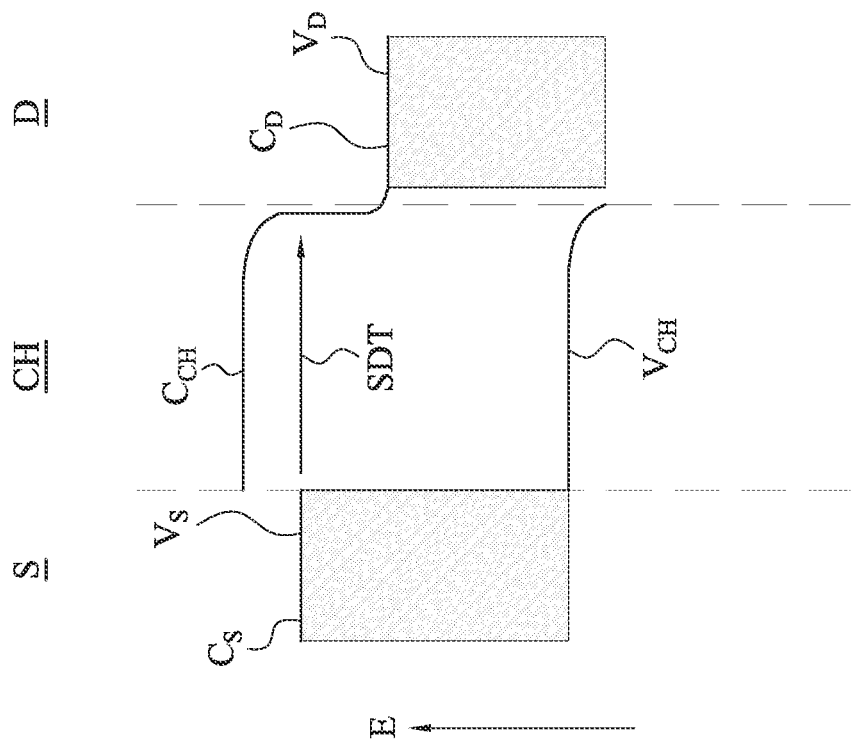
FIGS. 12A and 12B illustrate band diagrams of a semiconductor device in accordance with some embodiments of the present disclosure.
Figure 12B:
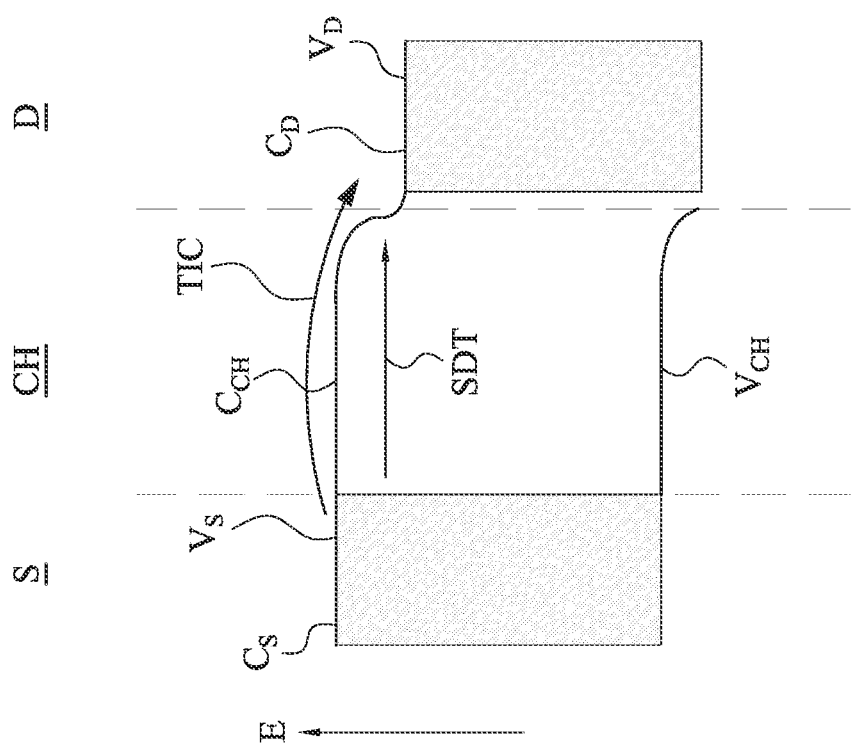

FIGS. 12A and 12B illustrate band diagrams of a semiconductor device as shown in FIGS. 11A and 11B in accordance with some embodiments of the present disclosure. In some embodiments, the semiconductor device as shown in FIGS. 11A and 11B is operated as a switch, having an OFF state, where there is no (or low) conductance through the device, and an ON state where there is higher conductance than OFF state. FIG. 12A is a band diagram in ON state, and FIG. 12B is a band diagram in OFF state.

FIGS. 12A and 12B show an example of the relative alignments of the conduction band and valence band along the lengthwise direction of the semiconductor fin 102 (see FIGS. 11A and 11B), with band offsets in both the conduction band and valence band. The band diagrams show the lower edge of the conduction band and the upper edge of the valence band. The band diagrams include a source S, a drain D, and a channel CH between the source S and the drain D. In some embodiments, the source S and the drain D may correspond respectively to the source/drain structures of FIGS. 11A and 11B (e.g., a combination of the third 2D material layer 150 and the underlying second portion 130B of the second 2D material layer 130), and the channel CH may correspond to the channel region of FIGS. 11A and 11B (e.g., the first 2D material layer 110).

As discussed above, the source S and drain D are not semiconductor and are semimetallic in behavior, and thus the upper edge of the source valence band Vs and lower edge of the source conduction band $C_S$ coincide or overlap, and the upper edge of the drain valence band $V_D$ a and lower edge of the drain conduction band $C_D$ coincide or overlap. Electrons occupy the valence band, as shown by the shading. In this situation, the source S and drain D have Fermi levels the same as the source conduction band $C_S$ and the drain conduction band $C_D$, respectively. On the other hand, with respect to the channel CH having semiconductor properties discussed above, there is a bandgap between the channel valence band $V_{CH}$ and the channel conduction band $C_{CH}$.

Referring to FIGS. 11A, 11B, and 12A, in the ON state, a first voltage is applied to the metal gate structure 170, which shifts the lower edge of the channel conduction band $C_{CH}$ level with or slightly above the occupation level (e.g., Fermi-level) of the source S (e.g., the conduction band $C_S$ of source S). In the band diagram of the ON state as shown in FIG. 12A, the current transport mechanism is a combination of thermal injection current TIC (or thermionic current) from the source conduction band $C_S$ to the drain conduction band $C_D$, travelling over the channel conduction band $C_{CH}$; and source-to-drain tunneling SDT from the source S to the drain conduction band $C_D$, tunneling through a barrier formed by the band gap in the channel CH. The thermal injection current TIC through the conduction bands $C_S$, $C_{CH}$, and $C_D$ is significantly larger than the source-to-drain tunneling SDT, and is the dominant transport process in the ON state. As a result, in the ON state, the source-to-drain tunneling SDT may be considered negligible. The first voltage may be the same, or higher than, a threshold voltage required to turn the semiconductor device of FIGS. 11A and 11B into the ON state. The threshold voltage is the lowest voltage at which thermal injection current TIC through the conduction bands $C_S$, $C_{CH}$, and $C_D$ occurs. Here, the term "thermal injection current" indicates the carriers that travel across the conduction bands $C_S$, $C_{CH}$, and $C_D$ via thermal kinetic energy.

Referring to FIGS. 11A, 11B, and 12B, in the OFF state, a second voltage is applied to the metal gate structure 170. In the band diagram of the OFF state as shown in FIG. 12B, the channel conduction band $C_{CH}$ is shifted above the occupation level (e.g., Fermi-level) of the source S (e.g., the conduction band $C_S$ of source S). The band gap of the channel CH is unchanged so the channel valence band $V_{CH}$ also shifts. In the OFF state, the thermal injection current TIC is suppressed due to the large band offset between the source S and the channel CH, and source-to-drain tunneling SDT becomes dominant in the current occurring in the OFF state. In some embodiments of the present disclosure, because the source/drain structures have semimetal properties, the source-to-drain tunneling SDT can be suppressed, and the detail will be explained below.

Figure 13:
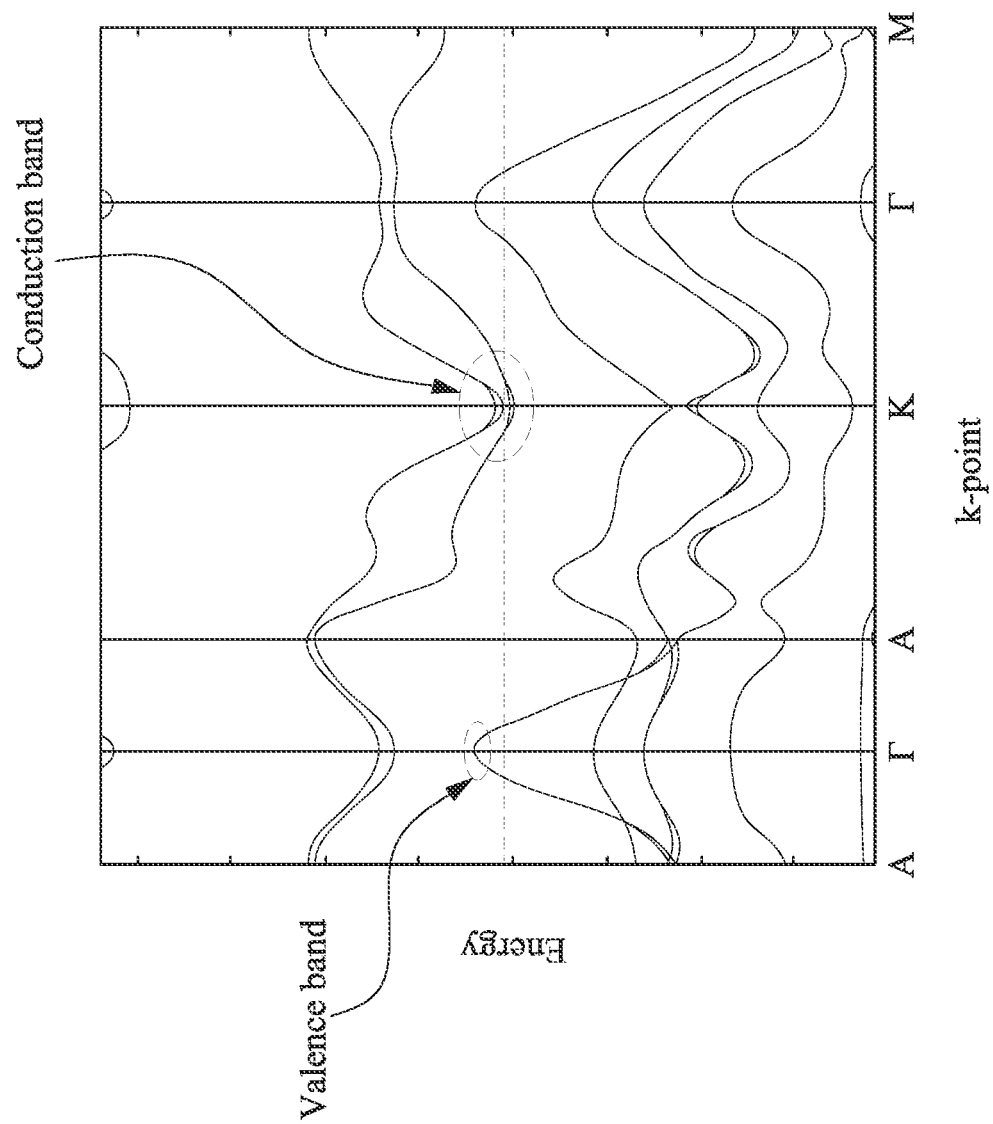
FIG. 13 illustrates a band structure of $PtSe_2$ in accordance with some embodiments of the present disclosure.

Reference is made to FIG. 13. FIG. 13 is a band structure of bulk $PtSe_2$, in which the "bulk $PtSe_2$" indicates a $PtSe_2$ layer having three or more monolayers (e.g., greater than 2.5 nm as discussed above), which exists semimetal properties. As shown in the band structure, the conduction band and the valence band of bulk $PtSe_2$ are at different symmetry k-points. For example, the conduction band of bulk $PtSe_2$ is at K valley, while the valence band of bulk $PtSe_2$ is at F valley. In this situation where the conduction band and the valence band are at different symmetry k-points, the tunneling between the conduction band and the valence band needs phonon's assistance. Because such addition mechanism (e.g., phonon's assistance) is required for triggering the tunneling effect, the possibility of tunneling effect will be reduced. As the source/drain structures of the present disclosure have semimetal properties with the conduction band and the valence band at different symmetry k-points, the possibility of tunneling effect between source S and drain D is reduced, and thus the source-to-drain tunneling SDT can be suppressed accordingly, which in turn will improve the subthreshold slope (SS) performance, as described in greater detail below. If the source/drain structures are made of semimetal having a conduction band and a valence band at the same k-point, the tunneling effect between source S and drain D may not be suppressed significantly, because the tunneling may occur without phonon's assistance, which in turn will increase the possibility of tunneling effect.

Figure 14:
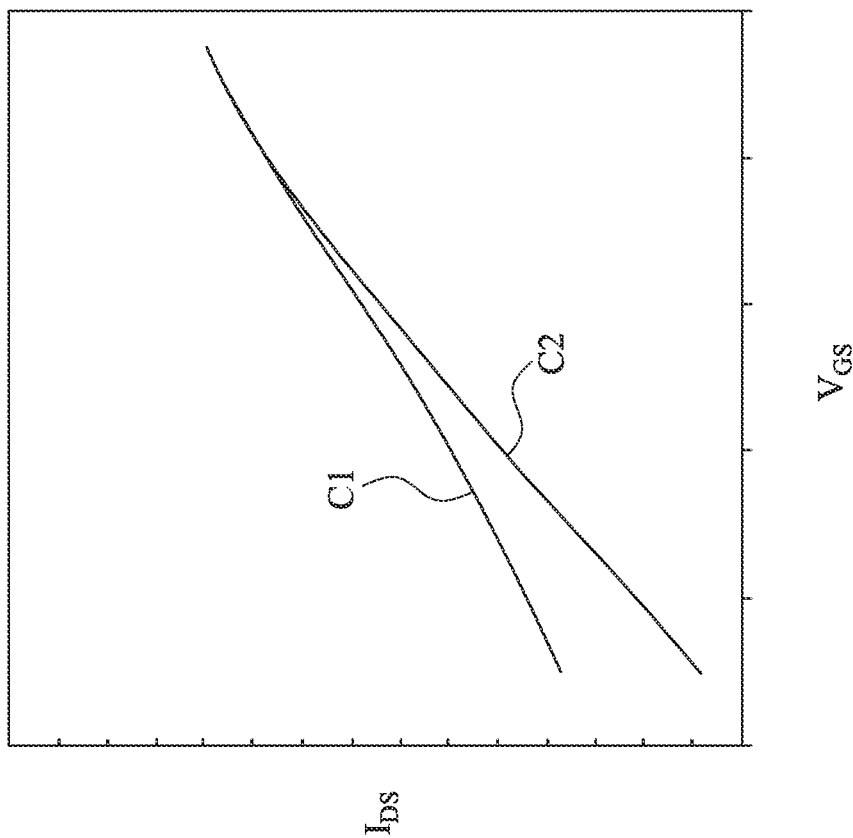
FIG. 14 illustrates simulation results of reduction of subthreshold slope of semiconductor device by introducing semimetallic source/drain structures in accordance with some embodiments.

Reference is made to FIGS. 11A, 11B, 12A, 12B, and 14. FIG. 14 shows the current passing through the channel CH from the source S to the drain D ($I_{DS}$) as a function of the gate voltage ($V_{GS}$) for a fixed source-drain voltage, in semi-log scale, at room temperature. The I-V curve has been calculated for the semiconductor device of FIGS. 11A and 11B above. Ideally, the source-drain current will be low for an OFF state, and high for an ON state, with a step change at the threshold voltage where the device switches from OFF to ON. In real devices that do not show a step change, the subthreshold slope (SS) is used to characterize how close to the ideal the device is. Here, the "subthreshold slope" is the slope of the curves in FIG. 14. As the SS gets increasing, the device moves away from ideal behavior.

In FIG. 14, Condition C1 illustrates a simulation result of a semiconductor device having n-doped or p-doped epitaxial source/drain structures according to some embodiments of the present disclosure. On the other hand, Condition C2 illustrates simulation result of a semiconductor device having un-doped semimetallic source/drain structures, such as the semiconductor device described in FIGS. 11A and 11B, according to some embodiments of the present disclosure. Comparing Condition C1 with Condition C2, the subthreshold slope (SS) of Condition C2 is lower than the subthreshold slope (SS) of Condition C1. This is because the unwanted source-to-drain tunneling SDT (see FIG. 12B) is suppressed by using semimetallic source/drain structures with the conduction band and the valence band at different symmetry k-points, as explained above with respect to FIG. 13. As a result, with this configuration, the subthreshold slope (SS) of Condition C2, which includes semiconductor device having semimetallic source/drain structures, is improved compared to the Condition C1.

On the other hand, because the source/drain structures have semimetal properties, the resistance of the source/drain structures can be reduced. Also, the contact resistance between the semimetallic source/drain structures and the source/drain contacts can also be reduced, which will improve the device performance.

FIG. 15 illustrates a method M1 of forming a logic device in accordance with some embodiments. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a semiconductor fin is formed over a substrate, and a plurality of isolation structures are formed over the substrate and adjacent to the semiconductor fin. FIGS. 1A and 1B illustrate some embodiments corresponding to act in block S101.

At block S102, a first 2D material layer, a gate dielectric layer, and a dummy gate layer are sequentially formed over the substrate. FIGS. 2A and 2B illustrate some embodiments corresponding to act in block S102.

At block S103, the first 2D material layer, the gate dielectric layer, and the dummy gate layer are patterned to form a patterned first 2D material layer and a dummy gate structure. FIGS. 3A and 3B illustrate some embodiments corresponding to act in block S103.

At block S104, a second 2D material layer is laterally grown from sidewalls of the first 2D material layer to extend along the exposed portions of the semiconductor fin and the isolation structures. FIGS. 4A and 4B illustrate some embodiments corresponding to act in block S104.

At block S105, a plurality of gate spacers are formed on opposite sidewalls of the dummy gate structure. FIGS. 5A and 5B illustrate some embodiments corresponding to act in block S105.

At block S106, a first interlayer dielectric (ILD) layer is formed adjacent to the gate spacers. FIGS. 6A and 6B illustrate some embodiments corresponding to act in block S106.

At block S107, the first ILD layer is patterned to form a plurality of openings exposing the second 2D material layer. FIGS. 7A and 7B illustrate some embodiments corresponding to act in block S107.

At block S108, a plurality of third 2D material layers are formed respectively in the openings. FIGS. 8A and 8B illustrate some embodiments corresponding to act in block S108.

At block S109, a second interlayer dielectric (ILD) layer is formed in the openings. FIGS. 9A and 9B illustrate some embodiments corresponding to act in block S109.

At block S110, the dummy gate structure is replaced with a metal gate structure. FIGS. 10A and 10B illustrate some embodiments corresponding to act in block S110.

At block S111, a plurality of source/drain contacts are formed in the second ILD layer. FIGS. 11A and 11B illustrate some embodiments corresponding to act in block S111.

FIGS. 16A to 27B illustrate a method for manufacturing a semiconductor device at various stages in accordance with some embodiments of the present disclosure. Some elements in FIG. 16A to 27B are the same or similar to those described with respect to FIGS. 1A to 11B, and thus relevant structural details will not be repeated hereinafter.

Figure 16A:
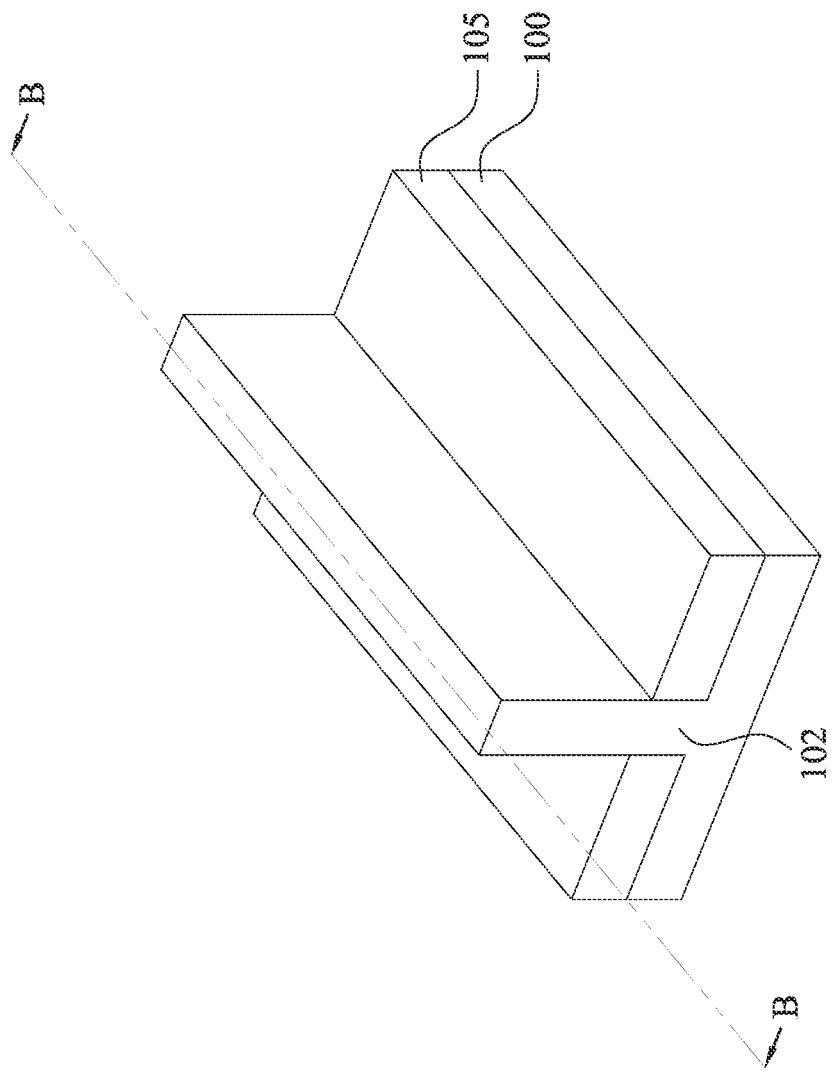
FIGS. 16A to 27B illustrate a method for manufacturing a semiconductor device at various stages in accordance with some embodiments of the present disclosure.
Figure 16B:
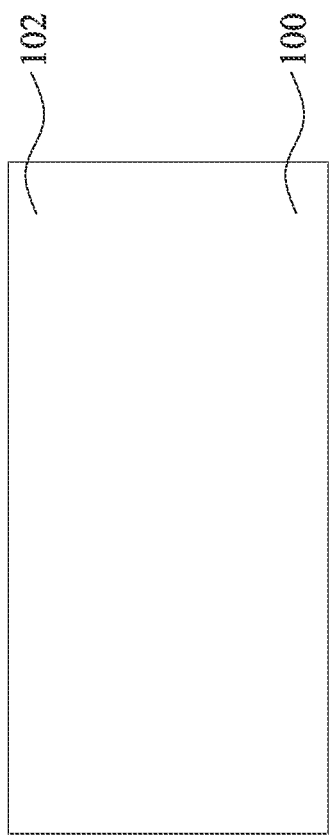

Reference is made to FIGS. 16A and 16B, in which FIG. 16B is a cross-sectional view along line B-B of FIG. 16A. A semiconductor fin 102 is formed over a substrate 100, and a plurality of isolation structures 105 are formed over the substrate 100 and adjacent to the semiconductor fin 102. The substrate 100, the semiconductor fin 102, and the isolation structures 105 are similar to those described in FIGS. 1A and 1B, and thus the formation process and materials thereof are omitted for simplicity.

Figure 17A:
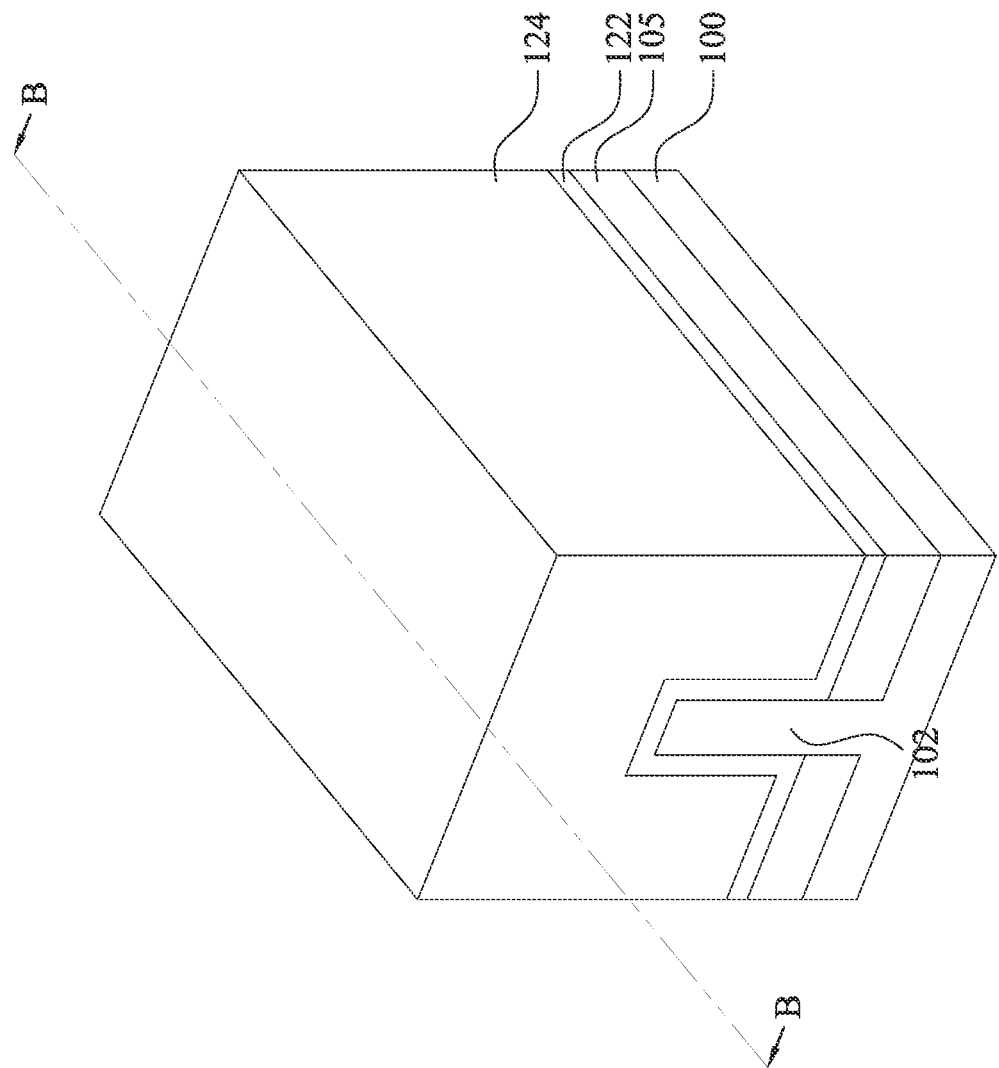
Figure 17B:
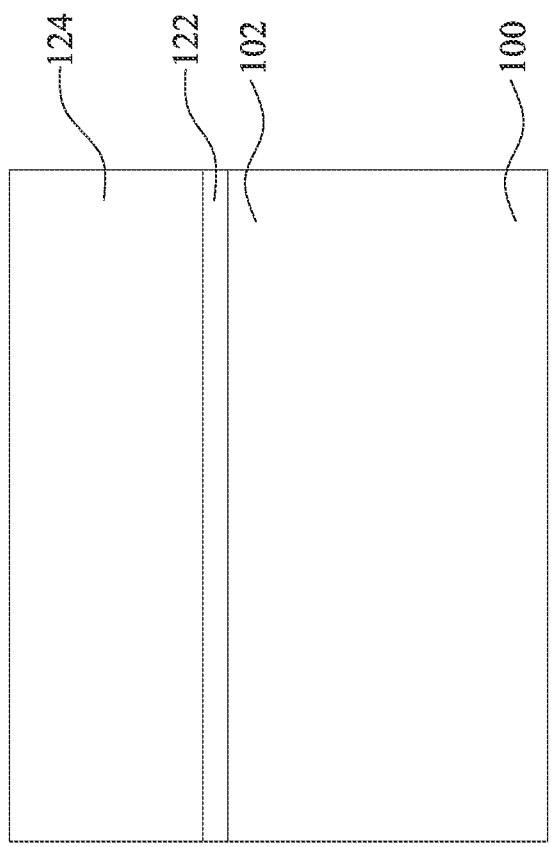

Reference is made to FIGS. 17A and 17B, in which FIG. 17B is a cross-sectional view along line B-B of FIG. 17A. A gate dielectric layer 122 and a dummy gate layer 124 are sequentially formed over the substrate 100. The gate dielectric layer 122 and the dummy gate layer 124 are similar to those described in FIGS. 2A and 2B, and thus the formation process and materials thereof are omitted for simplicity.

Figure 18A:
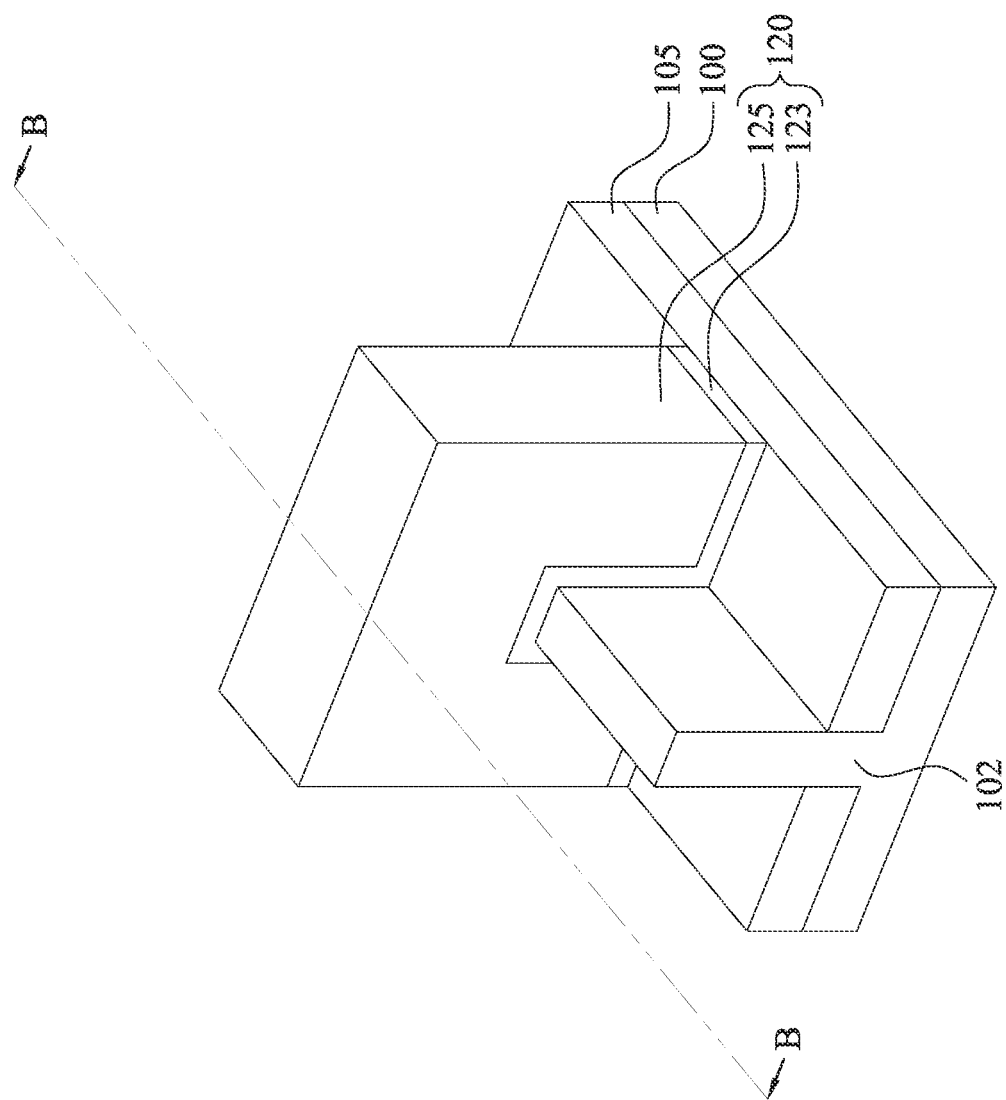

Reference is made to FIGS. 18A and 18B, in which FIG. 18B is a cross-sectional view along line B-B of FIG. 18A. The gate dielectric layer 122 and the dummy gate layer 124 are patterned to form a gate dielectric 123 and a dummy gate 125, such that portions of the semiconductor fin 102 and isolation structures 105 are exposed. The method for patterning the gate dielectric layer 122 and the dummy gate layer 124 is similar to those described in FIGS. 3A and 3B, and thus relevant details are omitted for simplicity.

Figure 19A:
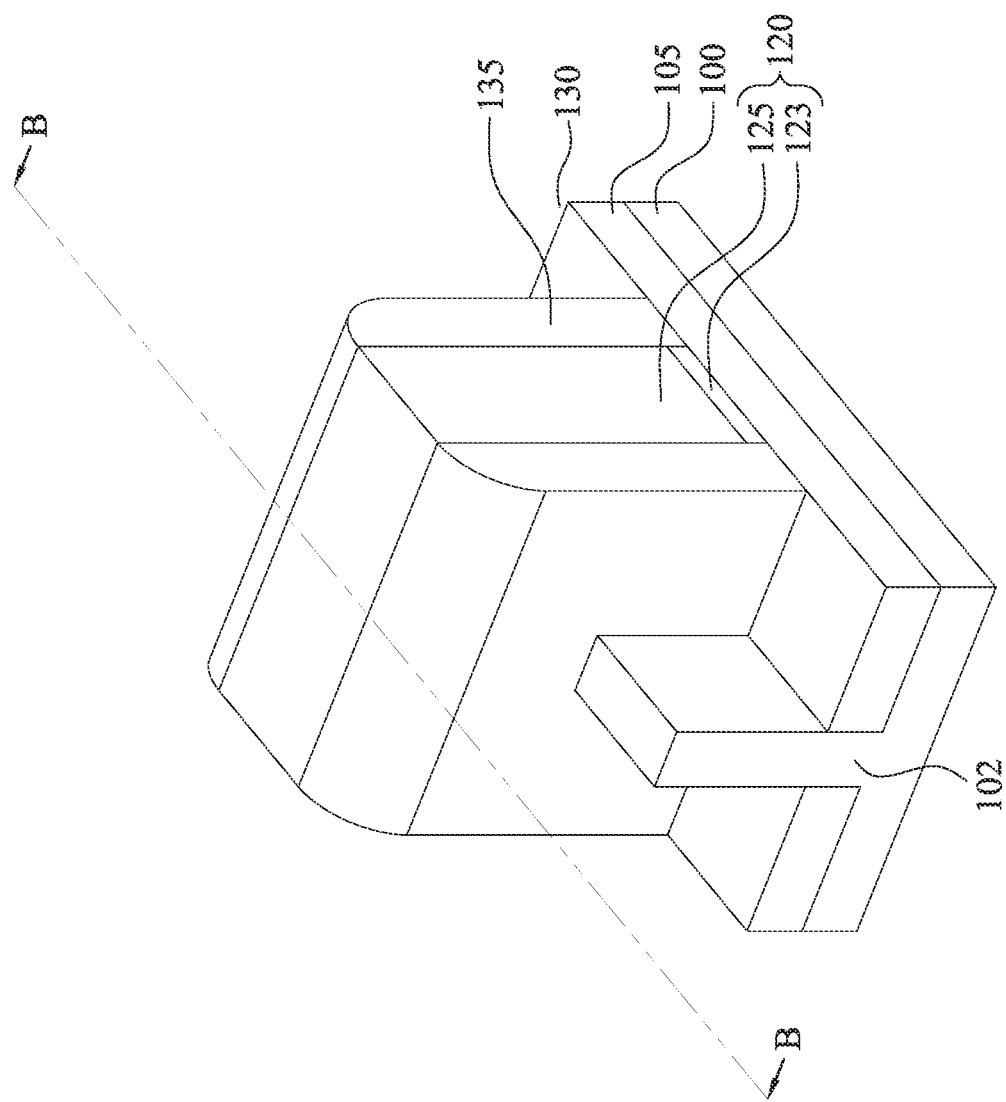
Figure 19B:
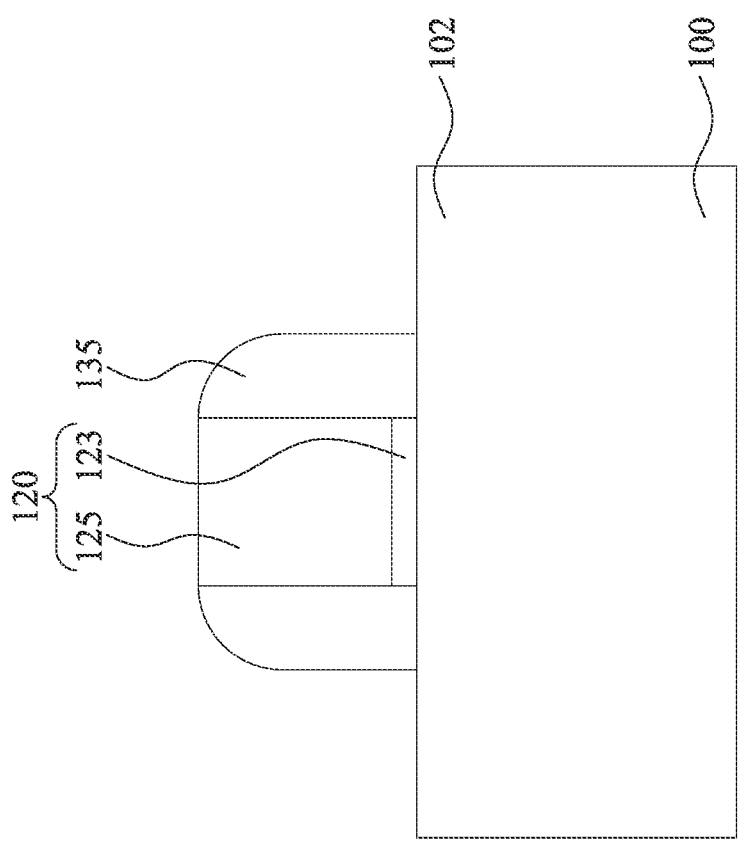

Reference is made to FIGS. 19A and 19B, in which FIG. 19B is a cross-sectional view along line B-B of FIG. 19A. A plurality of gate spacers 135 are formed on opposite sidewalls of the dummy gate structure 120. The gate spacers 135 are similar to those described in FIGS. 5A and 5B, and thus the formation process and materials thereof are omitted for simplicity.

Figure 20A:
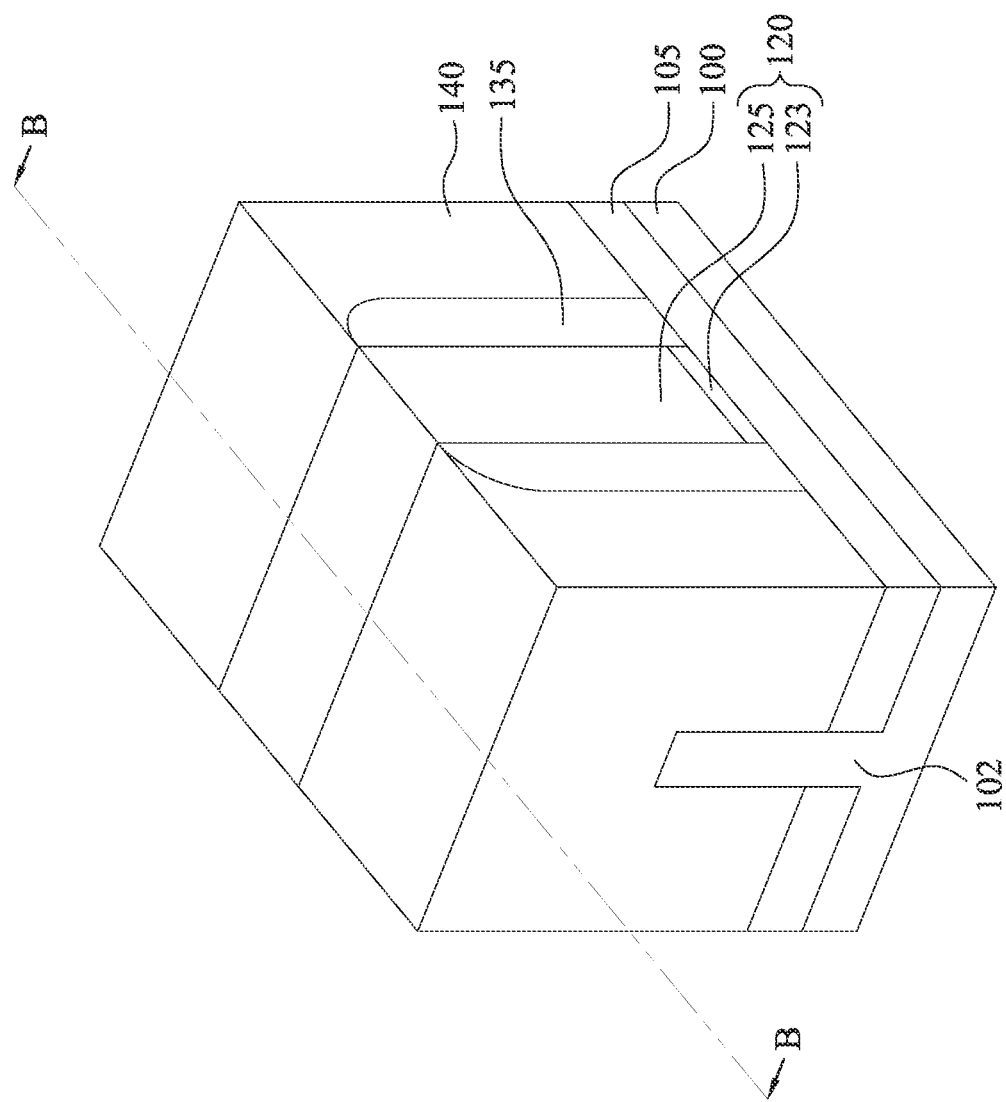
Figure 20B:
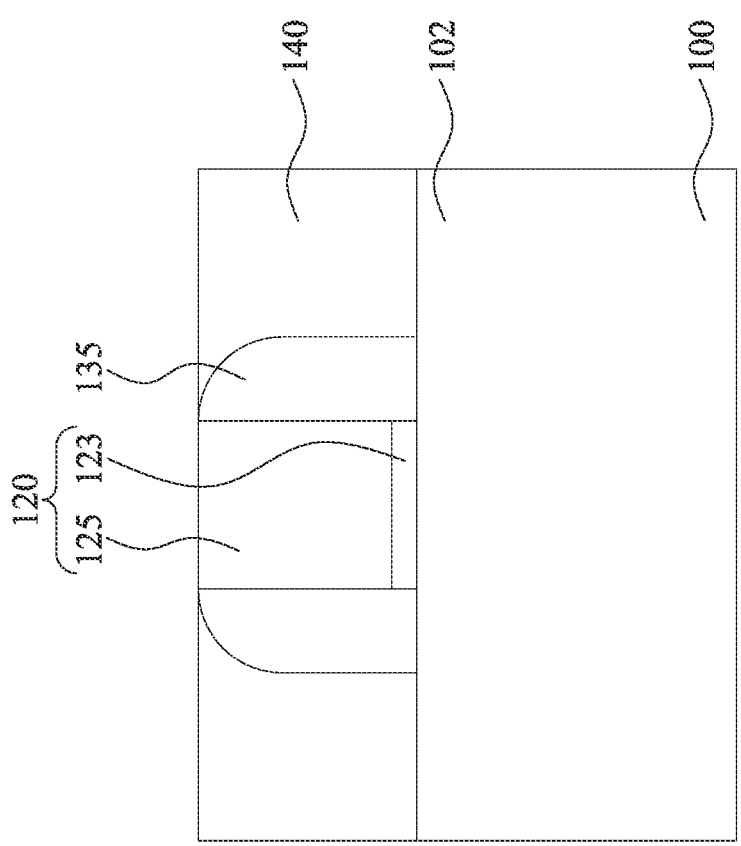

Reference is made to FIGS. 20A and 20B, in which FIG. 20B is a cross-sectional view along line B-B of FIG. 20A. An interlayer dielectric (ILD) layer 140 is formed adjacent to the gate spacers 135. The ILD layer 140 are similar to those described in FIGS. 6A and 6B, and thus the formation process and materials thereof are omitted for simplicity.

Figure 21A:
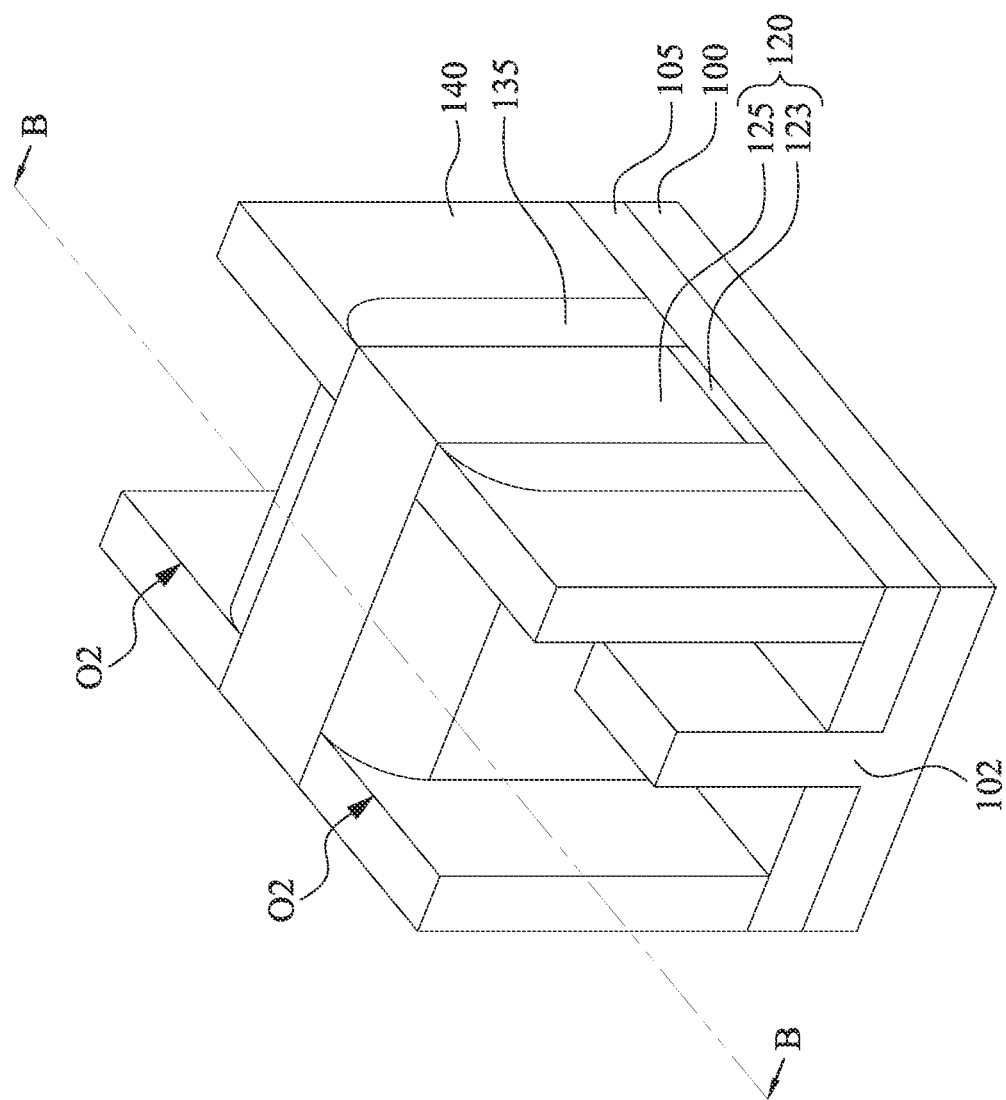
Figure 21B:
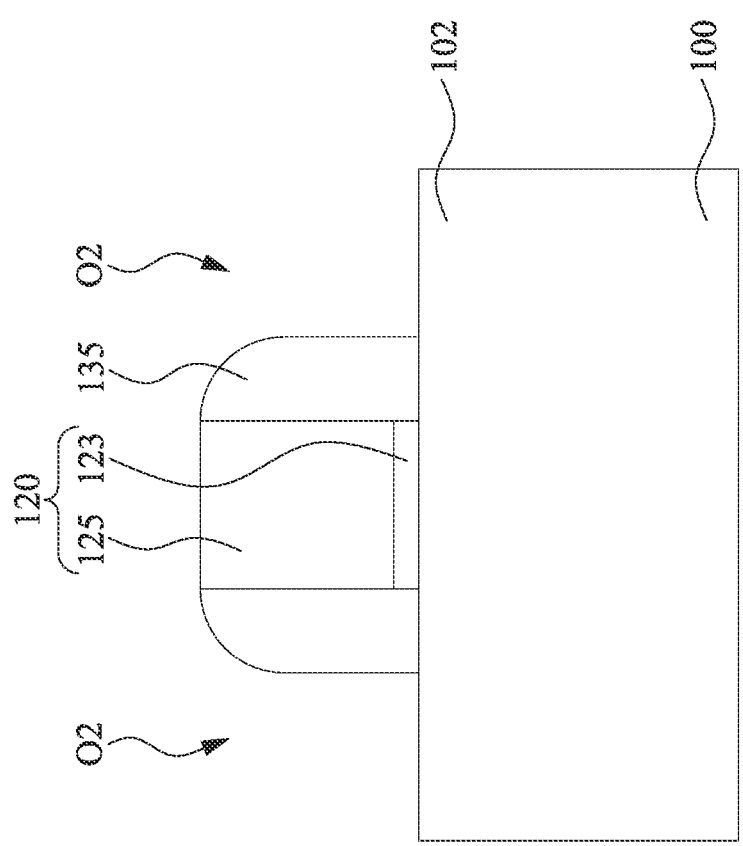

Reference is made to FIGS. 21A and 21B, in which FIG. 21B is a cross-sectional view along line B-B of FIG. 21A. The ILD layer 140 is patterned to form a plurality of first openings O2 exposing the semiconductor fin 102 and the isolation structures 105. The method for patterning the ILD layer 140 is similar to those described in FIGS. 7A and 7B, and thus relevant details are omitted for simplicity.

Figure 22A:
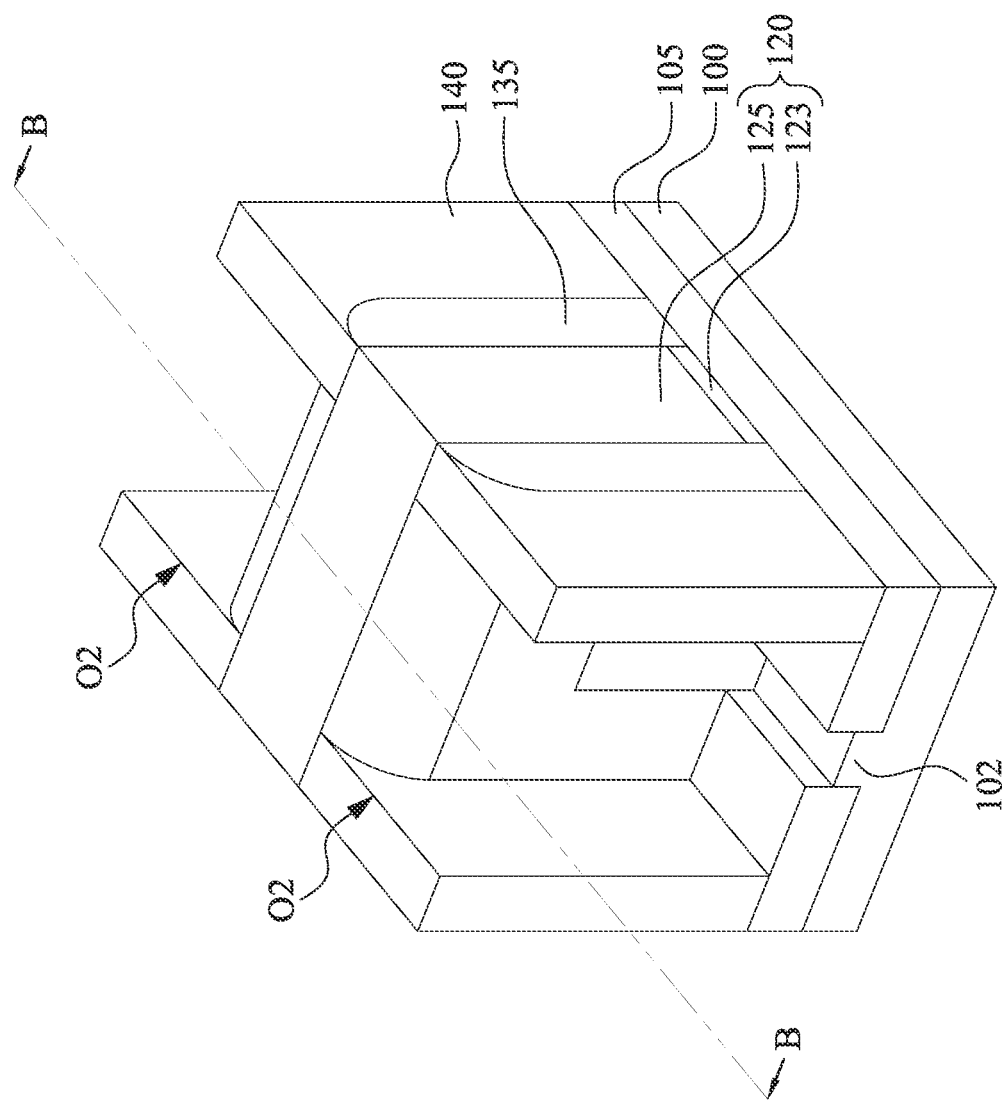

Reference is made to FIGS. 22A and 22B, in which FIG. 22B is a cross-sectional view along line B-B of FIG. 22A. The semiconductor fin 102 is etched to form a plurality of recesses R1 in the isolation structures 105. In greater detail, the etching process removes portions of the semiconductor fin 102 exposed by the dummy gate structure 120 and the gate spacers 105. In some embodiments, the etching process includes dry etching, wet etching, or combinations thereof.

Figure 23A:
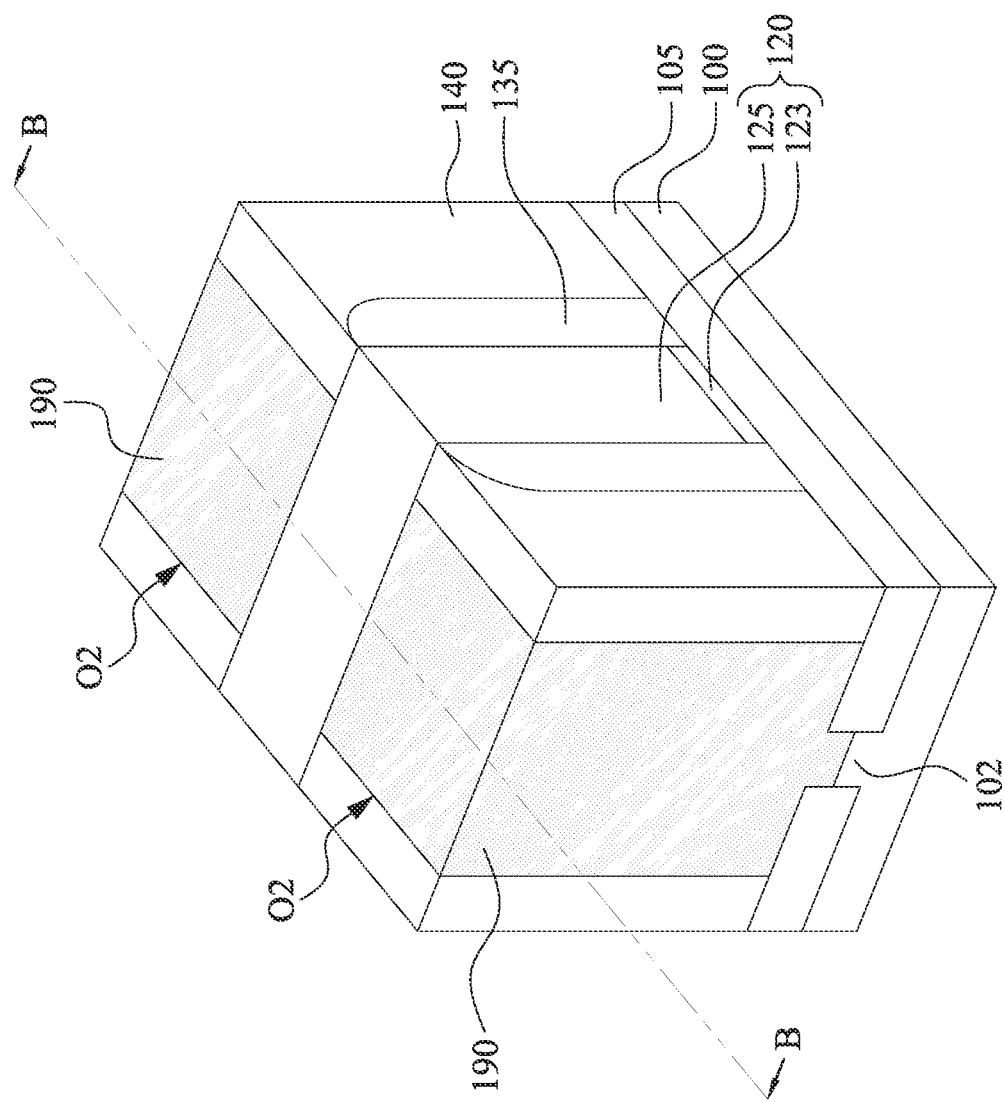
Figure 23B:
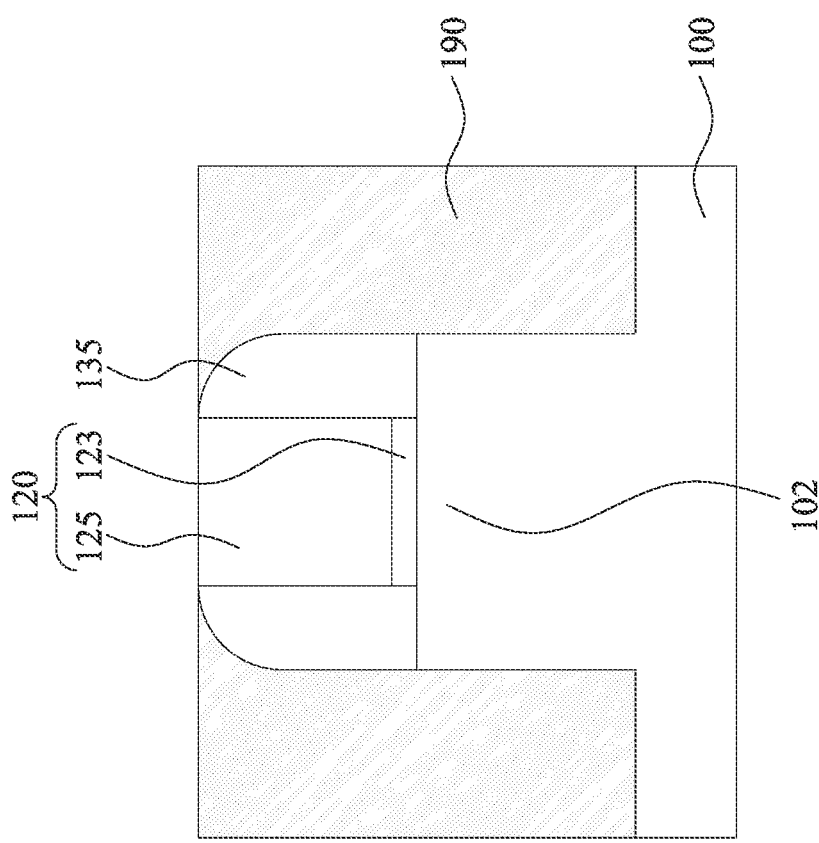

Reference is made to FIGS. 23A and 23B, in which FIG. 23B is a cross-sectional view along line B-B of FIG. 23A. A plurality of 2D material layers 190 are formed in the first openings O2 and the recesses R1. In some embodiments, the 2D material layers 190 can be formed by, for example, depositing a 2D material in the first openings O2 and the recesses R1, and followed by a CMP process to remove excessive material of the 2D material until the top surface of the dummy gates structure 120 is exposed. In some embodiments, the 2D material layers 190 has a thickness greater than about 2.5 nm, namely equal to or more than three monolayers of $PtSe_2$ (tri-layer), so that it has properties similar to semimetallic $PtSe_2$ layer as discussed previously with respect to the embodiments of FIGS. 1A to 15, and thus details thereof are omitted for simplicity.

Figure 24A:
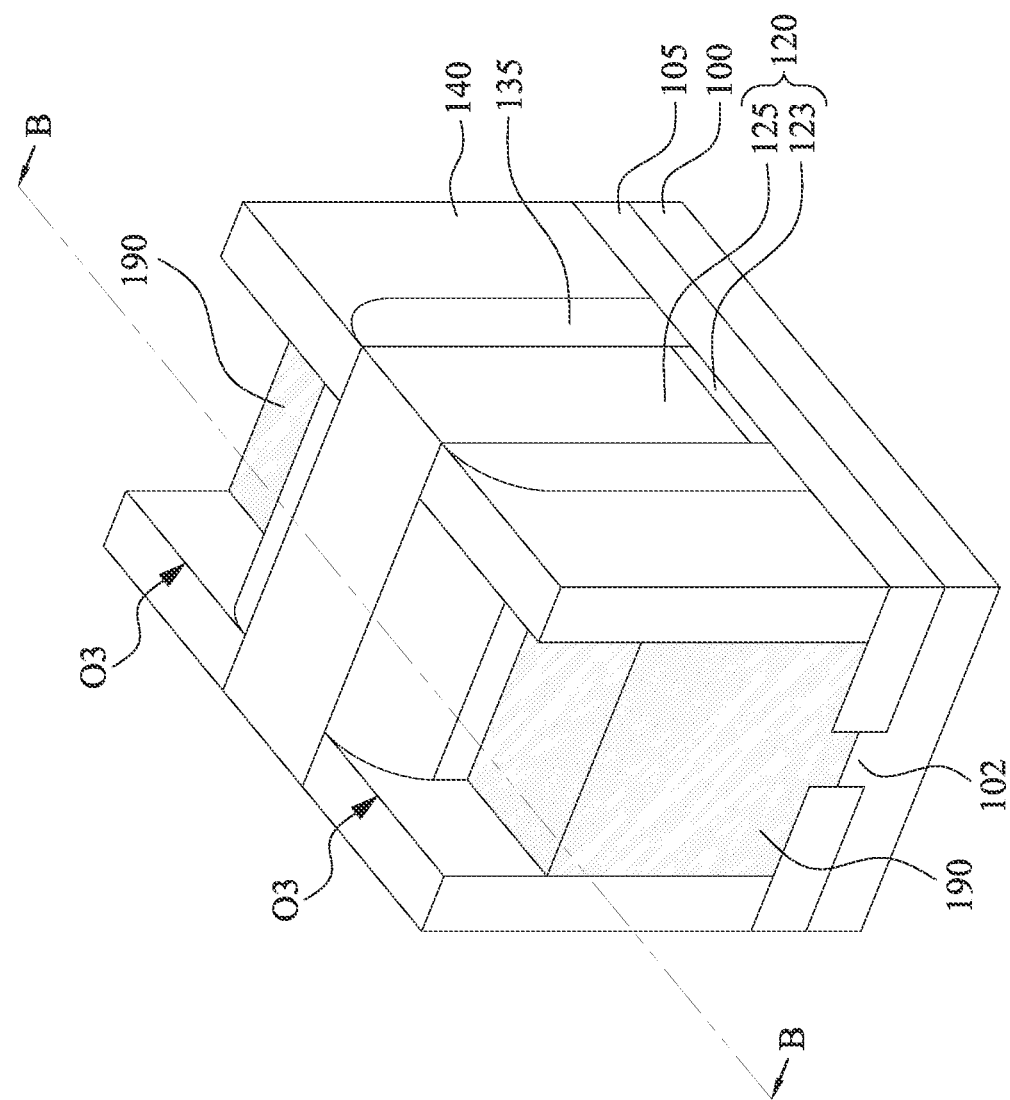
Figure 24B:
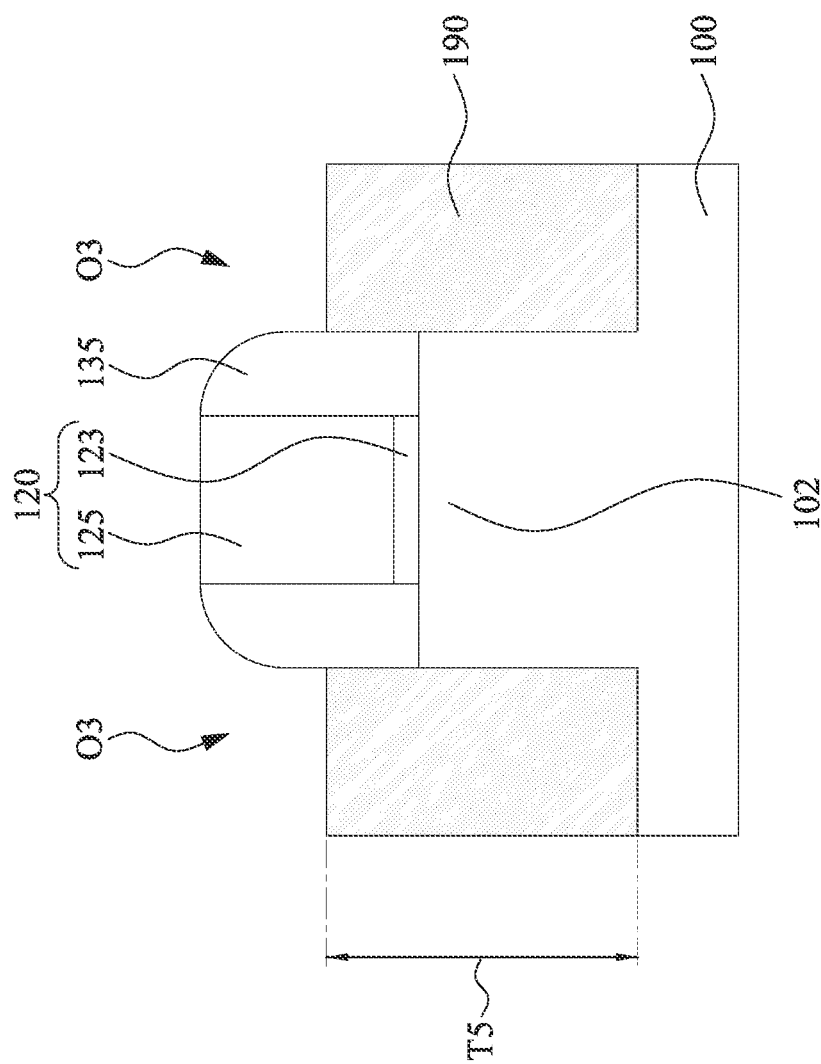

Reference is made to FIGS. 24A and 24B, in which FIG. 24B is a cross-sectional view along line B-B of FIG. 24A. The 2D material layers 190 are etched back to form a plurality of second openings O3 in the ILD layer 140. Etching back the 2D material layers 190 may be performed using dry etching, wet etching, or combinations thereof. In some embodiments, the etchant etches the 2D material layers 190 at a faster etching rate than it etches the ILD layer 140, the gate spacers 135, and the dummy gate structure 120. In some embodiments, an additional mask (e.g., photoresist) is used to protect the ILD layer 140, the gate spacers 135, and the dummy gate structure 120 during etching back the 2D material layers 190, and is removed after the etching back by using, for example, plasma ashing.

In FIG. 24B, each of the remaining 2D material layers 190 have a thickness T5. As discussed above with respect to FIGS. 1A to 15, in some embodiments where the 2D material layers 190 are made of un-doped $PtSe_2$, the thickness T5 of the 2D material layers 190 is greater than about 2.5 nm, namely equal to or more than three monolayers of un-doped $PtSe_2$ (tri-layer), such that the 2D material layers 190 can have semimetal properties to act as un-doped semimetallic source/drain structures. Accordingly, the remaining 2D material layers 190 can also be referred to as source/drain structures 190. If the 2D material layers 190 are etched back to have a thickness less than 2.5 nm, the remaining 2D material layers 190 may become semiconductor, and cannot act as source/drain structures in the final product. Stated another way, the etching back process is performed to thin the 2D material layers 190 and terminates before the thickness T5 of the 2D material layers 190 becomes lower than about 2.5 nm (i.e., the 2D material layers 190 becomes less than three monolayers). End point of the etching back process can be determined using, for example, a time mode.

As illustrated in FIG. 24A, each of the 2D material layers 190 has a portion 190A embedded in the isolation structures 105, in which the portion 190A extends along the sidewalls of the isolation structures 105. In some embodiments, the bottom surface of the portion 190A, namely the bottommost surface of the 2D material layers 190, is lower than the bottom surfaces of the dummy gate structure 120, the gate spacers 135, and the ILD layer 140. On the other hand, as illustrated in FIG. 24B, the portion of the semiconductor fin 102 remains under the dummy gate structure 120 and the gate spacer 135 will act as a channel region in the final product, and the 2D material layers 190 (or source/drain structures 190) extend along sidewalls of the channel region of the semiconductor fin 102.

Figure 25A:
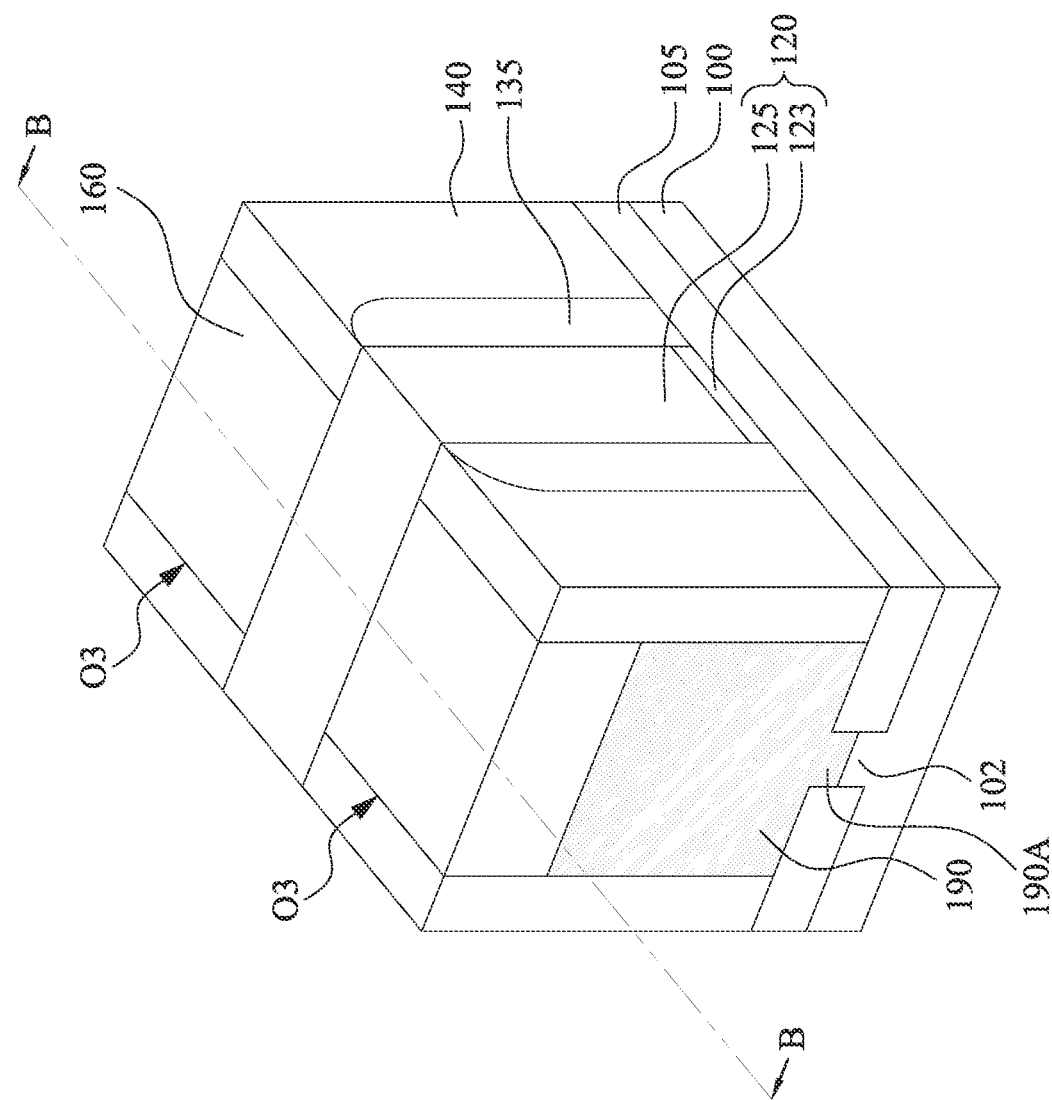
Figure 25B:
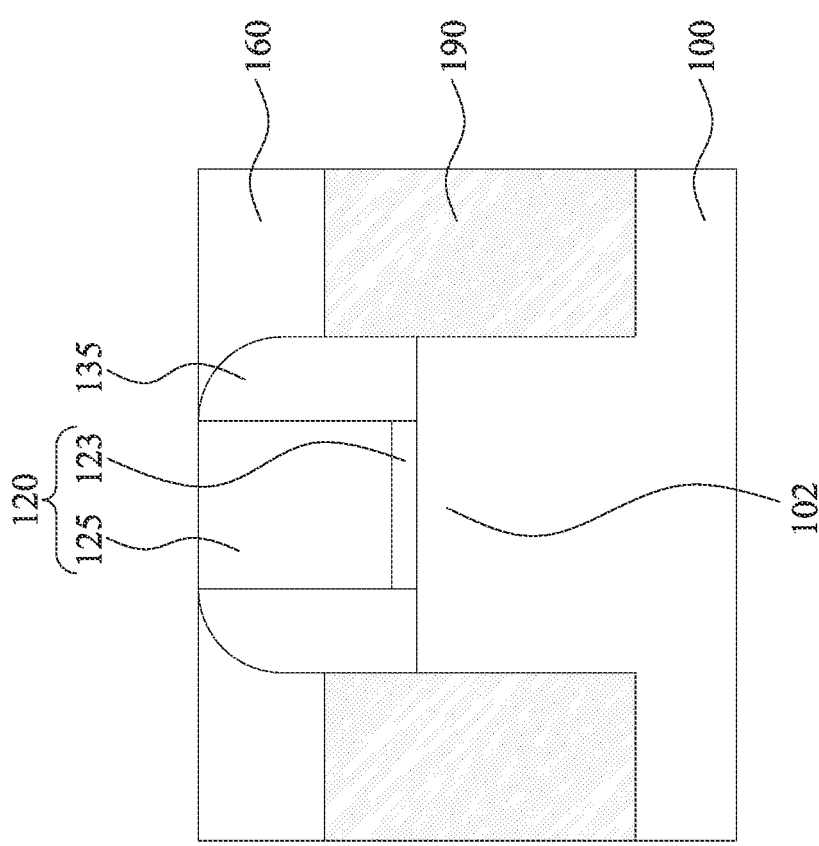

Reference is made to FIGS. 25A and 25B, in which FIG. 25B is a cross-sectional view along line B-B of FIG. 25A. An interlayer dielectric (ILD) layer 160 is formed in the second openings O3. The ILD layer 160 is similar to those described in FIGS. 9A and 9B, and thus the formation process and materials thereof are omitted for simplicity.

Figure 26A:
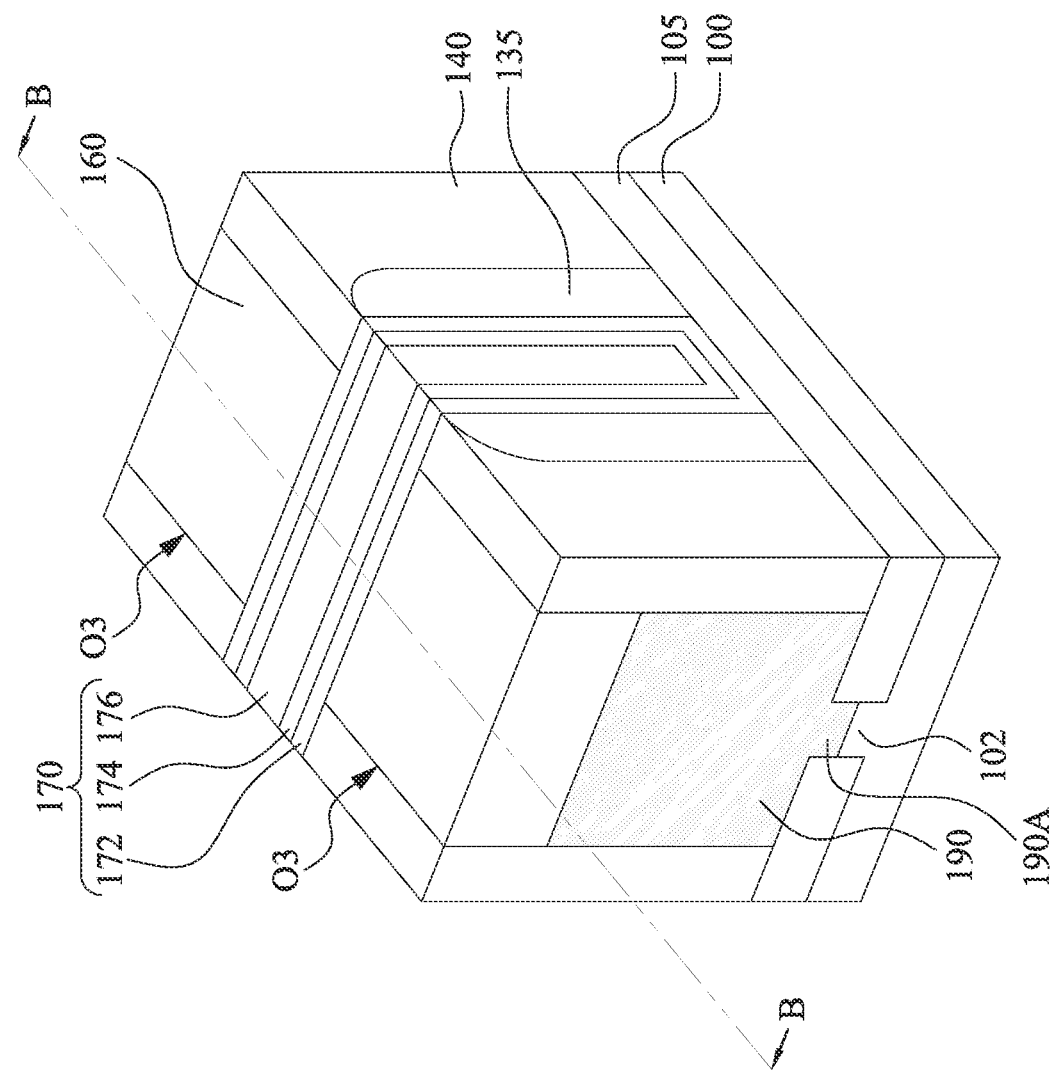
Figure 26B:
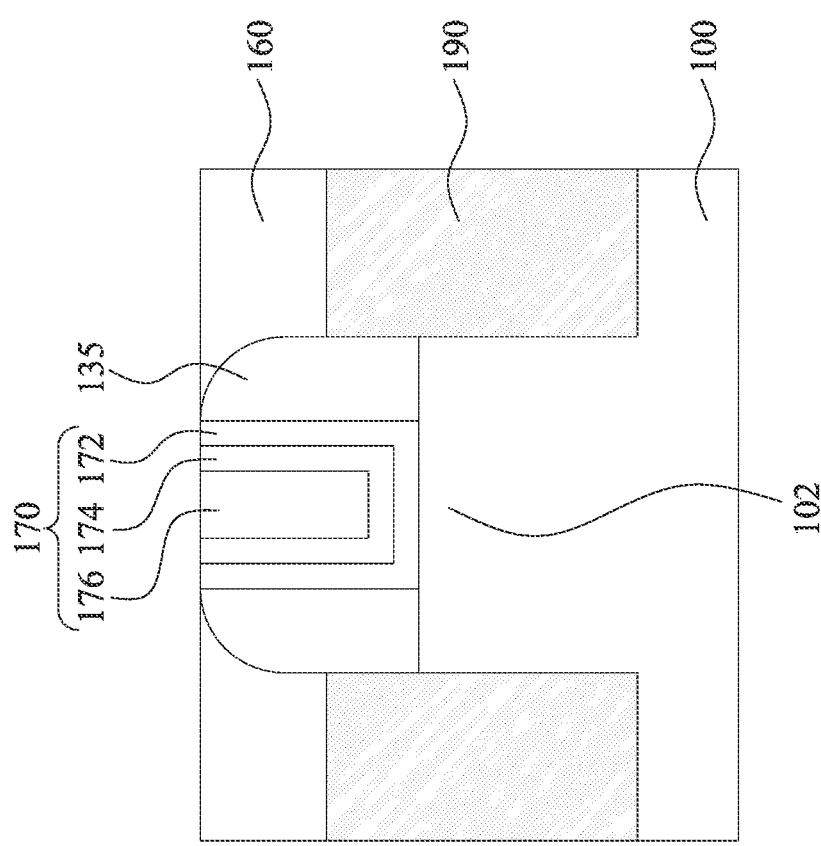

Reference is made to FIGS. 26A and 26B, in which FIG. 26B is a cross-sectional view along line B-B of FIG. 26A. The dummy gate structure 120 is replaced with a metal gate structure 170. In some embodiments, the metal gate structure 170 includes a gate dielectric layer 172, a work function metal layer 174 over the gate dielectric layer 172, and a gate electrode 176 over the work function metal layer 174. The metal gate structure 170 is similar to those described in FIGS. 10A and 10B, and thus the formation process and materials thereof are omitted for simplicity.

Figure 27A:
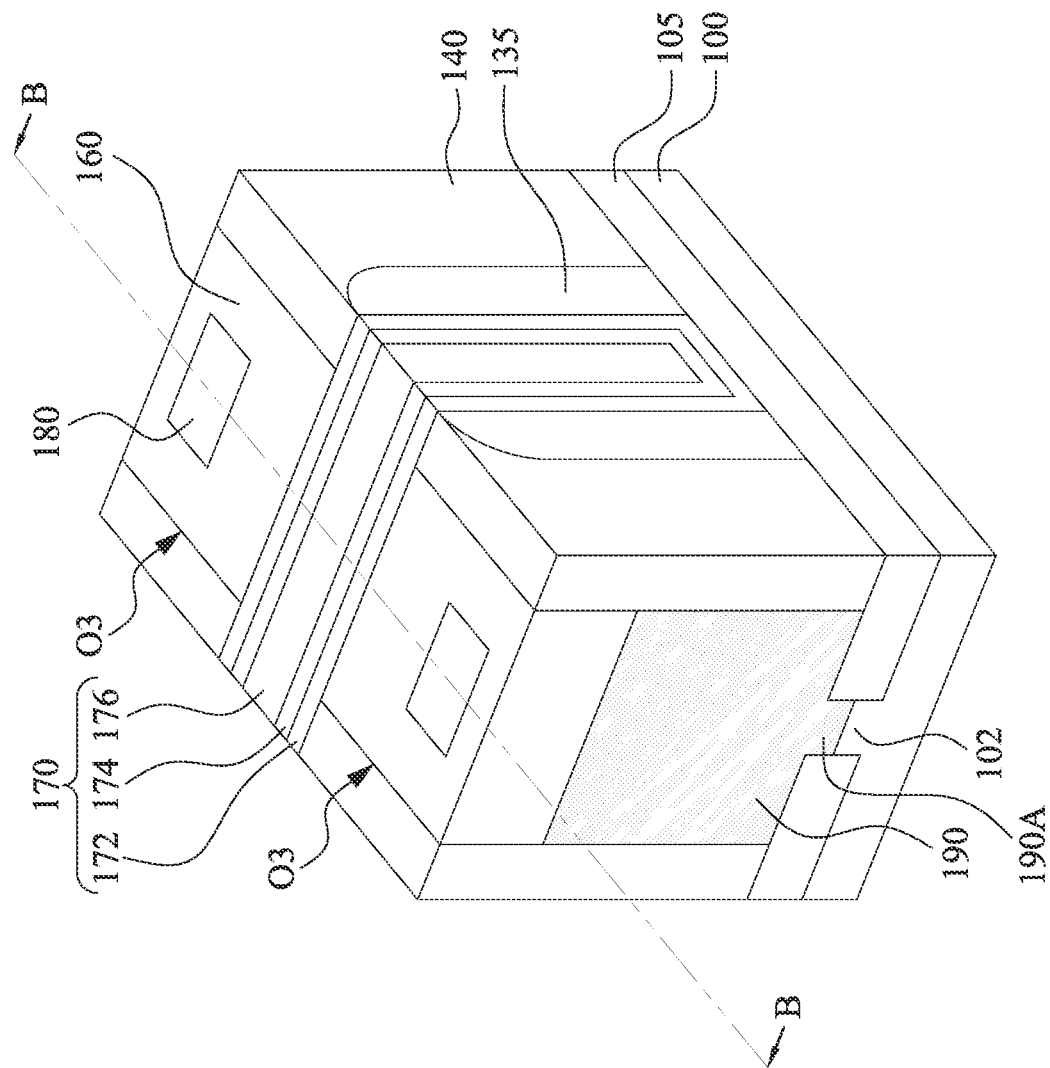
Figure 27B:
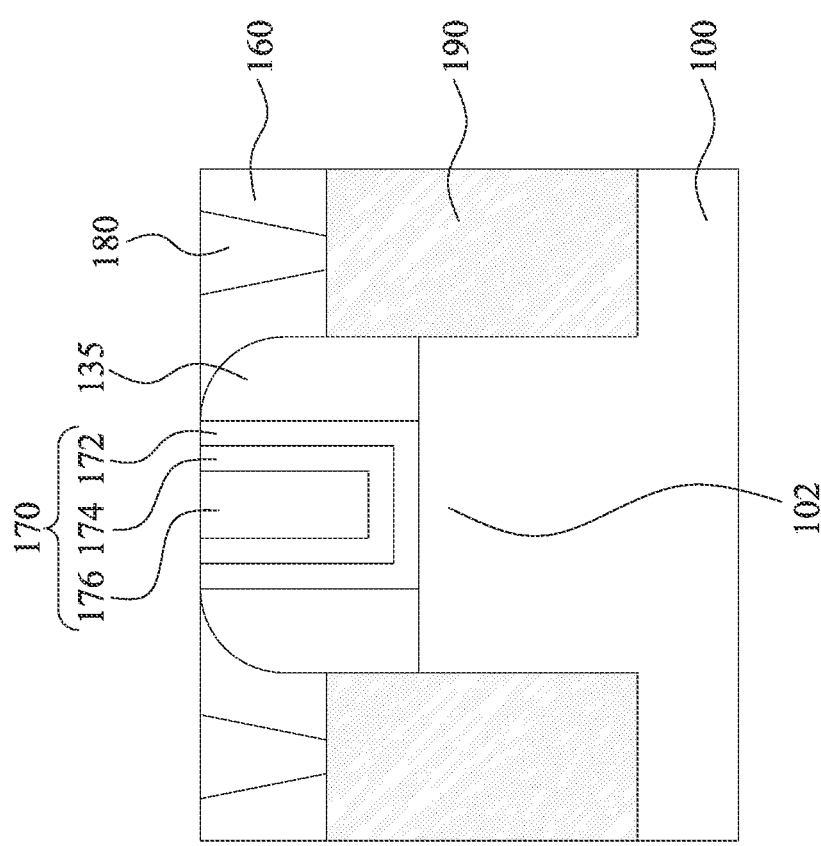

Reference is made to FIGS. 27A and 27B, in which FIG. 27B is a cross-sectional view along line B-B of FIG. 27A. A plurality of source/drain contacts 180 are formed in the ILD layer 160. The source/drain contacts 180 are similar to those described in FIGS. 11A and 11B, and thus the formation process and materials thereof are omitted for simplicity.

Figure 28:
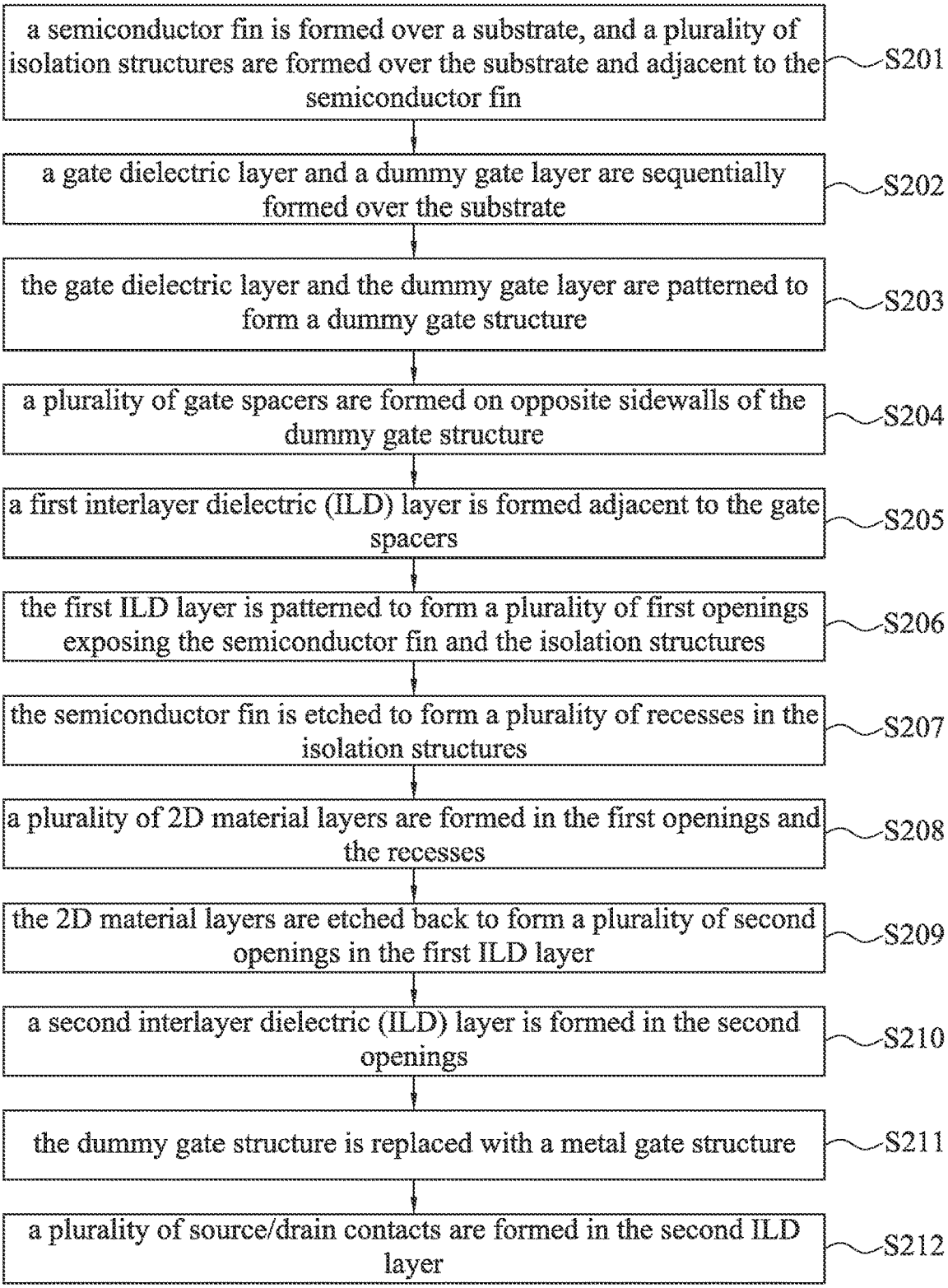
FIG. 28 illustrates a method of forming a semiconductor device in accordance with some embodiments of the present disclosure.

FIG. 28 illustrates a method M2 of forming a logic device in accordance with some embodiments. Although the method M2 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S201, a semiconductor fin is formed over a substrate, and a plurality of isolation structures are formed over the substrate and adjacent to the semiconductor fin. FIGS. 16A and 16B illustrate some embodiments corresponding to act in block S201.

At block S202, a gate dielectric layer and a dummy gate layer are sequentially formed over the substrate. FIGS. 17A and 17B illustrate some embodiments corresponding to act in block S202.

At block S203, the gate dielectric layer and the dummy gate layer are patterned to form a dummy gate structure. FIGS. 18A and 18B illustrate some embodiments corresponding to act in block S203.

At block S204, a plurality of gate spacers are formed on opposite sidewalls of the dummy gate structure. FIGS. 19A and 19B illustrate some embodiments corresponding to act in block S205.

At block S205, a first interlayer dielectric (ILD) layer is formed adjacent to the gate spacers. FIGS. 20A and 20B illustrate some embodiments corresponding to act in block S205.

At block S206, the first ILD layer is patterned to form a plurality of first openings exposing the semiconductor fin and the isolation structures. FIGS. 21A and 21B illustrate some embodiments corresponding to act in block S206.

At block S207, the semiconductor fin is etched to form a plurality of recesses in the isolation structures. FIGS. 22A and 22B illustrate some embodiments corresponding to act in block S207.

At block S208, a plurality of 2D material layers are formed in the first openings and the recesses. FIGS. 23A and 23B illustrate some embodiments corresponding to act in block S208.

At block S209, the 2D material layers are etched back to form a plurality of second openings in the first ILD layer. FIGS. 24A and 24B illustrate some embodiments corresponding to act in block S209.

At block S210, a second interlayer dielectric (ILD) layer is formed in the second openings. FIGS. 25A and 25B illustrate some embodiments corresponding to act in block S210.

At block S211, the dummy gate structure is replaced with a metal gate structure. FIGS. 26A and 26B illustrate some embodiments corresponding to act in block S211.

At block S212, a plurality of source/drain contacts are formed in the second ILD layer. FIGS. 27A and 27B illustrate some embodiments corresponding to act in block S212.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that source/drain structures of a semiconductor device are made of (2D) material having semimetal properties with the conduction band and the valence band at different symmetry k-points. Because the possibility of tunneling effect between the semimetallic source/drain structures is lower than that of the epitaxial source/drain structures, the short channel tunneling can be suppressed in the disclosed semiconductor device, and therefore lowering the subthreshold slope. Another advantage is that the resistance of the semimetallic source/drain structures is lower than the epitaxial source/drain structures, and the contact resistance between the semimetallic source/drain structures and the source/drain contacts can also be reduced, which will improve the device performance.

In some embodiments of the present disclosure, a method includes forming a semiconductor fin protruding above a substrate; forming a first 2D material layer across the semiconductor fin; depositing a gate material layer over the first 2D material layer; etching the gate material layer and the first 2D material layer to form a gate structure and a patterned first 2D material layer under the gate structure; laterally growing a second 2D material layer from the patterned first 2D material layer to beyond the gate structure; after laterally growing the second 2D material layer, forming gate spacers respectively on opposite sidewalls of the gate structure; and after forming the gate spacers, forming a third 2D material layer on the second 2D material layer until a combination of the third 2D material layer and the second 2D material layer comprises at least three or more monolayers of $PtSe_2$.

In some embodiments of the present disclosure, a method includes forming a semiconductor fin protruding above a substrate; forming isolation structures on opposite sides of the semiconductor fin; forming a gate structure crossing the semiconductor fin; forming an interlayer dielectric (ILD) layer on opposite sides of the gate structure; patterning the ILD layer to form openings that expose a top surface of the semiconductor fin; and forming 2-D material source/drain structures in the openings.

In some embodiments of the present disclosure, a method includes forming a semiconductor fin protruding above a substrate; forming a gate structure crossing the semiconductor fin; forming a first 2-D material layer on a top surface of the semiconductor fin exposed by the gate structure; forming gate spacers on opposite sidewalls of the gate structure and on a top surface of the first 2-D material layer; and after forming the gate spacers, depositing a second 2-D material layer over the first 2-D material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a semiconductor fin protruding above a substrate;
    forming a first 2D material layer across the semiconductor fin;
    depositing a gate material layer over the first 2D material layer;
    etching the gate material layer and the first 2D material layer to form a gate structure and a patterned first 2D material layer under the gate structure;
    laterally growing a second 2D material layer, by using a sidewall of the patterned first 2D material layer as a base layer, along a surface of the semiconductor fin, such that the second 2D material layer and the patterned first 2D material layer have substantially a same thickness;
    after laterally growing the second 2D material layer, forming gate spacers respectively on opposite sidewalls of the gate structure; and
    after forming the gate spacers, forming a third 2D material layer on the second 2D material layer until a combination of the third 2D material layer and the second 2D material layer comprises at least three or more monolayers of $PtSe_2$.

2. The method of claim 1, wherein laterally growing the second 2D material layer is performed such that the second 2D material layer covers a region of the semiconductor fin that is exposed by the gate structure.

3. The method of claim 1, wherein laterally growing the second 2D material layer is performed such that the second 2D material layer extends along a top surface of a shallow trench isolation (STI) structure around the semiconductor fin.

4. The method of claim 1, further comprising:
    removing the gate structure from the patterned first 2D material layer; and
    after removing the gate structure, forming a metal gate structure on the patterned first 2D material layer.

5. The method of claim 1, further comprising:
    forming a source/drain contact on the third 2D material layer.

6. The method of claim 1, further comprising:
    prior to forming the third 2D material layer, forming an interlayer dielectric (ILD) layer covering the second 2D material layer; and
    patterning the ILD layer to form openings in the ILD layer that expose the second 2D material layer, wherein the third 2D material layer is formed on an exposed portion of the second 2D material layer.

7. The method of claim 6, further comprising:
    after forming the third 2D material layer, filling the openings of the ILD layer with a dielectric layer; and
    performing a chemical mechanism polishing process to the dielectric layer until a top surface of the ILD layer is exposed.

8. A method, comprising:
    forming a semiconductor fin protruding above a substrate;
    forming isolation structures on opposite sides of the semiconductor fin;
    forming a gate structure crossing the semiconductor fin;
    forming a gate spacer along a sidewall of the gate structure;
    forming an interlayer dielectric (ILD) layer on opposite sides of the gate structure;
    patterning the ILD layer to form openings that expose a first 2D material layer over the semiconductor fin, wherein the gate spacer is in contact with a top surface of the first 2D material layer; and
    forming a second 2D material layer on the first 2D material layer through the openings until a combination of the second 2D material layer and the first 2D material layer comprises at least three or more monolayers of a 2D material.

9. The method of claim 8, wherein the 2D material comprises $PtSe_2$.

10. The method of claim 8, wherein the first 2D material layer is in contact with a third 2D material layer between the gate structure and the semiconductor fin.

11. The method of claim 8, further comprising etching back the second 2D material layer.

12. The method of claim 8, further comprising filling the openings of the ILD layer with a dielectric layer to cover the second 2D material layer.

13. The method of claim 8, further comprising:
    replacing the gate structure with a metal gate structure; and
    forming source/drain contacts over the second 2D material layer, respectively.

14. A method, comprising:
    forming a semiconductor fin protruding above a substrate;
    forming a gate structure crossing the semiconductor fin;
    after forming the gate structure, forming a first 2D material layer on a top surface of the semiconductor fin exposed by the gate structure;
    forming gate spacers on opposite sidewalls of the gate structure and in contact with a top surface of the first 2D material layer; and
    after forming the gate spacers, depositing a second 2D material layer over the first 2D material layer until a combination of the second 2D material layer and the first 2D material layer comprises at least three or more monolayers of a 2D material.

15. The method of claim 14, further comprising prior to forming the gate structure, forming a third 2D material layer over the semiconductor fin, wherein the first 2D material layer is formed by laterally grown a 2D material from the third 2D material layer.

16. The method of claim 15, wherein the third 2D material layer has a semiconductive property, while a combination of the first and second 2D material layers has a semimetallic property.

17. The method of claim 14, further comprising forming a shallow trench isolation (STI) structure laterally surrounding the semiconductor fin, wherein the first 2D material layer is formed on a top surface of the STI structure.

18. The method of claim 14, further comprising:
   prior to depositing the second 2D material layer, forming an interlayer dielectric (ILD) layer covering the first 2D material layer; and
   patterning the ILD layer to form openings in the ILD layer that expose the first 2D material layer, wherein the second 2D material layer is formed on an exposed portion of the first 2D material layer.

19. The method of claim 18, wherein the second 2D material layer has a higher growing rate on a surface of the first 2D material layer than on a surface of the ILD layer.

20. The method of claim 14, wherein the 2D material comprises $PtSe_2$.

* * * * *